US012635232B2

(12) United States Patent (10) Patent No.: US 12,635,232 B2
Liang et al. (45) Date of Patent: May 19, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Chun-Sheng Liang, Changhua County (TW); Yu-San Chien, Hsinchu (TW); Pin Chun Shen, Changhua County (TW); Wen-Chiang Hong, Taipei (TW); Chun-Wing Yeung, Hsinchu (TW)

(73) Assignee: Taiwan Semiconductor Manufactuing Company, Ltd., Hsinchu (TW)

( * ) Notice: Subject to any disclaimer, the term of this patent is extended or adjusted under 35 U.S.C. 154(b) by 624 days.

(21) Appl. No.: 18/161,742

(22) Filed: Jan. 30, 2023

(65) Prior Publication Data

US 2024/0128267 A1 Apr. 18, 2024

Related U.S. Application Data

(60) Provisional application No. 63/415,284, filed on Oct. 12, 2022.

(51) Int. Cl.
H10D 30/01 (2025.01)
H10D 30/43 (2025.01)
(Continued)

(52) U.S. Cl.
CPC .......... H10D 84/85 (2025.01); H10D 30/014 (2025.01); H10D 30/43 (2025.01);
(Continued)

(58) Field of Classification Search
CPC ........ H10D 30/501–509; H10D 30/019–0198; H10D 30/43–435; H10D 62/119–123; H10D 30/014; Y10S 977/938
See application file for complete search history.

(56) References Cited

U.S. PATENT DOCUMENTS 9,209,247 B2 12/2015 Colinge et al.
9,236,267 B2 1/2016 De et al.
(Continued)

*Primary Examiner* — Matthew C Landau
*Assistant Examiner* — Nora T. Nix
(74) *Attorney, Agent, or Firm* — JCIPRNET

(57) ABSTRACT

A semiconductor device includes a first semiconductor structure, a second semiconductor structure, a first isolation block and a second isolation block. The first semiconductor structure includes a first gate structure wrapping around a first sheet structures and a second sheet structures, and a first dielectric wall disposed between and separating the first and second sheet structures. The second semiconductor structure includes a second gate structure wrapping around third sheet structures. The first isolation block is disposed on the first dielectric wall of the first semiconductor structure and separates the first gate structure into a first gate portion wrapping around the first sheet structures and a second gate portion wrapping around the second sheet structures. The second isolation block is disposed between the first and second semiconductor structures and separates the first gate structure from the second gate structure. The first isolation block has an extending depth smaller than an extending depth of the second isolation block.

20 Claims, 30 Drawing Sheets

(51) Int. Cl.

| | |
|---|---|
| *H10D 30/67* | (2025.01) |
| *H10D 62/10* | (2025.01) |
| *H10D 84/01* | (2025.01) |
| *H10D 84/03* | (2025.01) |
| *H10D 84/85* | (2025.01) |

(52) U.S. Cl.
CPC ....... *H10D 30/6735* (2025.01); *H10D 62/121* (2025.01); *H10D 84/0167* (2025.01); *H10D 84/0188* (2025.01); *H10D 84/038* (2025.01)

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 11,164,942 B1* | 11/2021 | Weckx | H10D 62/121 |
| 11,367,662 B2* | 6/2022 | Dentoni Litta | H10D 30/0243 |
| 2021/0082766 A1* | 3/2021 | Miura | H10D 84/038 |
| 2021/0210637 A1* | 7/2021 | Zhang | H10D 30/031 |
| 2021/0273075 A1* | 9/2021 | Pan | H10D 84/038 |
| 2021/0391222 A1* | 12/2021 | Xie | H10D 84/0177 |
| 2022/0093734 A1* | 3/2022 | Chan | H10D 30/6748 |
| 2022/0328642 A1* | 10/2022 | Jin | H10D 62/121 |
| 2023/0197525 A1* | 6/2023 | Briggs | H10D 84/0188 |
| | | | 438/154 |
| 2024/0113104 A1* | 4/2024 | Yemenicioglu | H10D 30/014 |

* cited by examiner

SEMICONDUCTOR DEVICE AND MANUFACTURING METHOD THEREOF

CROSS-REFERENCE TO RELATED APPLICATION

This application claims the priority benefit of U.S. provisional application Ser. No. 63/415,284, filed on Oct. 12, 2022. The entirety of the above-mentioned patent application is hereby incorporated by reference herein and made a part of this specification.

BACKGROUND

For integrated circuit (IC) technology, functional density (i.e., the number of interconnected devices per chip area) keeps increasing while geometry size (i.e., the smallest component (or line) that can be created using a fabrication process) keeps decreasing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
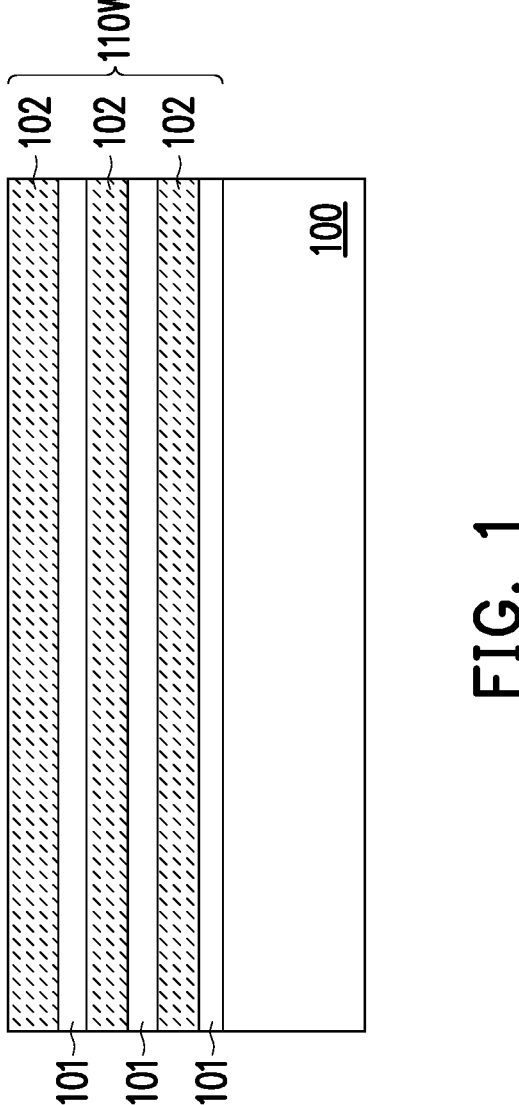
FIG. 1 through FIG. 27 are schematic cross-sectional views and plane views of the structure of a semiconductor device at various stages of a manufacturing method for the semiconductor device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is generally related to semiconductor devices and fabrication methods, and more particularly to fabricating transistors such as fork-sheet field effect transistors (fork-sheet FETs). A metal gate cutting process refers to a fabrication process to form isolation blocks to cut the metallic/metal gate(s) (or gate line(s)) into several portions (or segments) after the metallic/metal gate is formed through the gate replacement process. The separate portions of the metallic/metal gate(s) function as gates for individual transistors. According to some embodiments of the present disclosure, the isolation blocks are formed through a metal gate cutting process including at least two exposure steps using two different photomasks followed by etching steps. Through using a two-staged gate cutting process, precise control and better alignment for the formed isolation blocks can be achieved along with a larger process window, leading to more relaxed spacing requirements between adjacent fork-sheet nanostructure. By utilizing such two staged gate cutting process, the isolation blocks are precisely landed on the dielectric isolation walls of the fork-sheet nanostructure (s), significantly reducing the occurrence of misalignment and/or over-etching and improving the reliability and performance of the transistors.

FIG. 1 through FIG. 27 are schematic cross-sectional views and plane views of the structure of a semiconductor device at various stages of a manufacturing method for the semiconductor device according to some embodiments of the present disclosure. Referring to FIG. 1, in some embodiments, a stack 110W of alternating semiconductor layers is formed on a substrate 100. In some embodiments, the substrate 100 includes a semiconductor bulk substrate such as a silicon bulk substrate. For example, the substrate 100 includes various layers, including conductive layers and/or insulating layers. Further, the substrate 100 may include various doping configurations depending on design requirements. In some embodiments, different doping profiles (e.g., n-wells, p-wells) may be formed in the substrate 100 in regions designed for different device types (e.g., n-type devices and p-type devices) through ion implantation of dopants and/or diffusion processes. In some embodiments, the substrate 100 also includes other semiconductor materials such as germanium, silicon carbide (SiC), silicon germanium (SiGe), or diamond. In some embodiments, the substrate 100 includes a compound semiconductor, an alloy semiconductor, an epitaxial layer (epi-layer), a silicon-on-insulator (SOI) structure, and/or other suitable features.

In some embodiments, the stack 110W includes epitaxial layers 101 of a first semiconductor material interposed by epitaxial layers 102 of a second semiconductor material, and the first and second semiconductor materials are different. In some embodiments, the epitaxial layers 101 include silicon germanium (SiGe) and the epitaxial layers 102 include silicon (Si). In some embodiments, the formation of the first or second semiconductor material includes one or more processes selected from chemical vapor deposition (CVD), atomic layer deposition (ALD), vapor phase epitaxy (VPE), molecular beam epitaxy (MBE), or the like. It is noted that the numbers of aforementioned epitaxy layers are described for illustrative purposes only and not intended to further limit the present disclosure. It is appreciated that the number of the epitaxial layers in the stack 110W determines the number of the channel sheets for the semiconductor device.

In some embodiments, the epitaxial layers 101 have a substantially uniform first thickness, and the epitaxial layers 102 have a substantially uniform second thickness. In some embodiments, the first thickness and the second thickness are identical or different. As described in more detail below, the epitaxial layers 102 or parts thereof may serve as channel member(s) for a subsequently-formed semiconductor device and the thickness of each of the epitaxial layers 102 is chosen based on device performance considerations. The epitaxial layers 101 in channel regions(s) may eventually be removed and serve to define a vertical distance between adjacent channel region(s) for a subsequently-formed semiconductor device and the thickness of each of the epitaxial layers 101 is chosen based on device performance considerations. Accordingly, the epitaxial layers 101 is also referred to as sacrificial layers 101, and epitaxial layers 102 is also referred to as channel layers 102.

Figure 2:
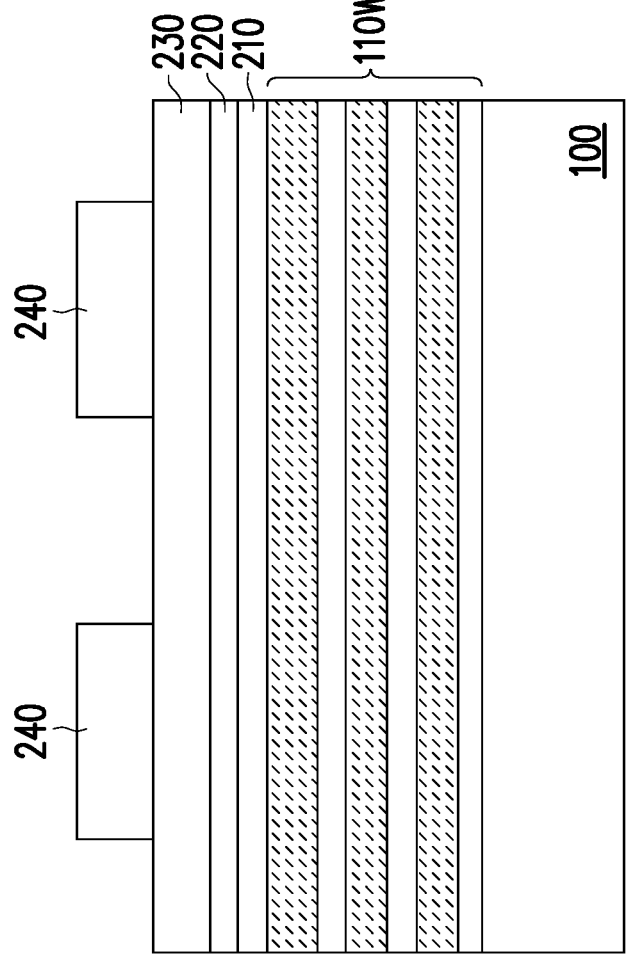

Referring to FIG. 2, in some embodiments, a pad oxide layer 210, a pad nitride layer 220, a hard mask layer 230, and a photoresist pattern 240 are sequentially formed on the substrate 100. In some embodiments, the pad oxide layer 210, the pad nitride layer 220, and the hard mask layer 230 are formed using CVD, low-pressure CVD (LPCVD), plasma-enhanced CVD (PECVD), ALD, thermal oxidation, or other suitable deposition techniques, or combinations thereof. In some embodiments, the pad oxide layer 210 includes silicon oxide, and the pad nitride layer 220 includes silicon nitride, silicon oxynitride and/or silicon carbide. In some embodiments, the lithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof.

Figure 3:
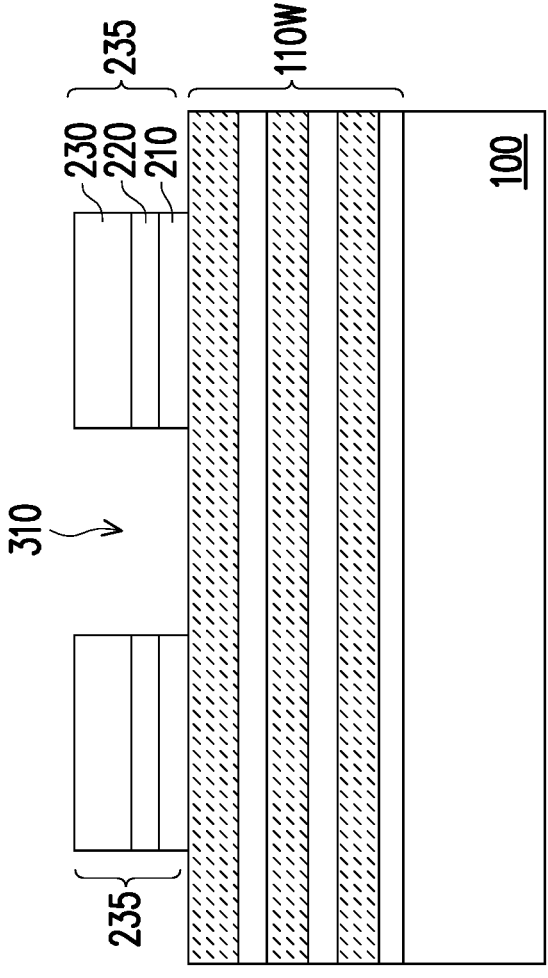

Referring to FIG. 3, in some embodiments, using the photoresist pattern 240 as a mask, the pad oxide layer 210, the pad nitride layer 220, and the hard mask layer 230 are patterned into a mask pattern 235 with trenches 310 by using one or more etching processes. And then, the photoresist pattern 240 is removed. In some embodiments, the etching processes include dry etching processes, wet etching processes, or a combination thereof.

Figure 4B:
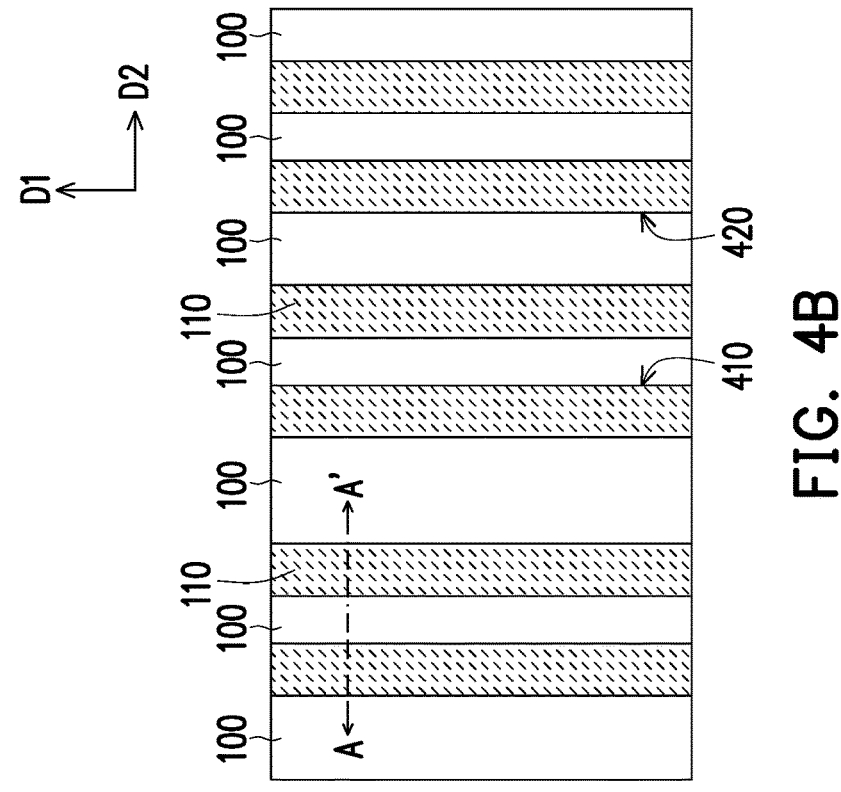
Figure 4A:
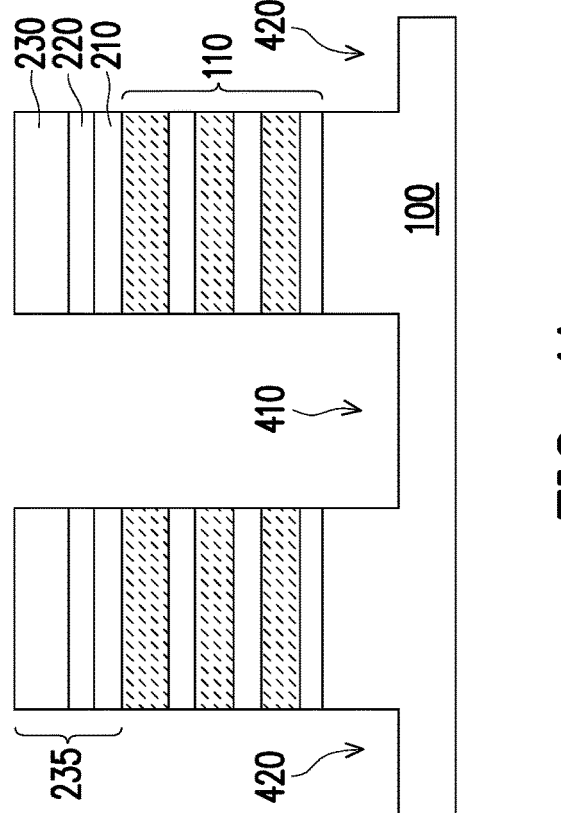

FIG. 4B is a schematic plane view showing an exemplary structure of the semiconductor device according to some embodiments of the present disclosure. FIG. 4A is a schematic cross-sectional view illustrating a cross-section of the exemplary structure as shown in FIG. 4B along the cross-section line A-A'. Referring to FIGS. 4A and 4B, in some embodiments, using the above mask pattern 235 as an etching mask, the stack 110W is patterned into patterned stacks 110 with narrower trenches 410 and wider trenches 420 formed there-between by using one or more etching processes. In some embodiments, the patterning process includes at least one anisotropic etching process. In some embodiments, the patterning process includes one or more suitable etching processes, such as reactive ion etch (RIE), neutral beam etch (NBE), or a combination thereof.

Figure 5:
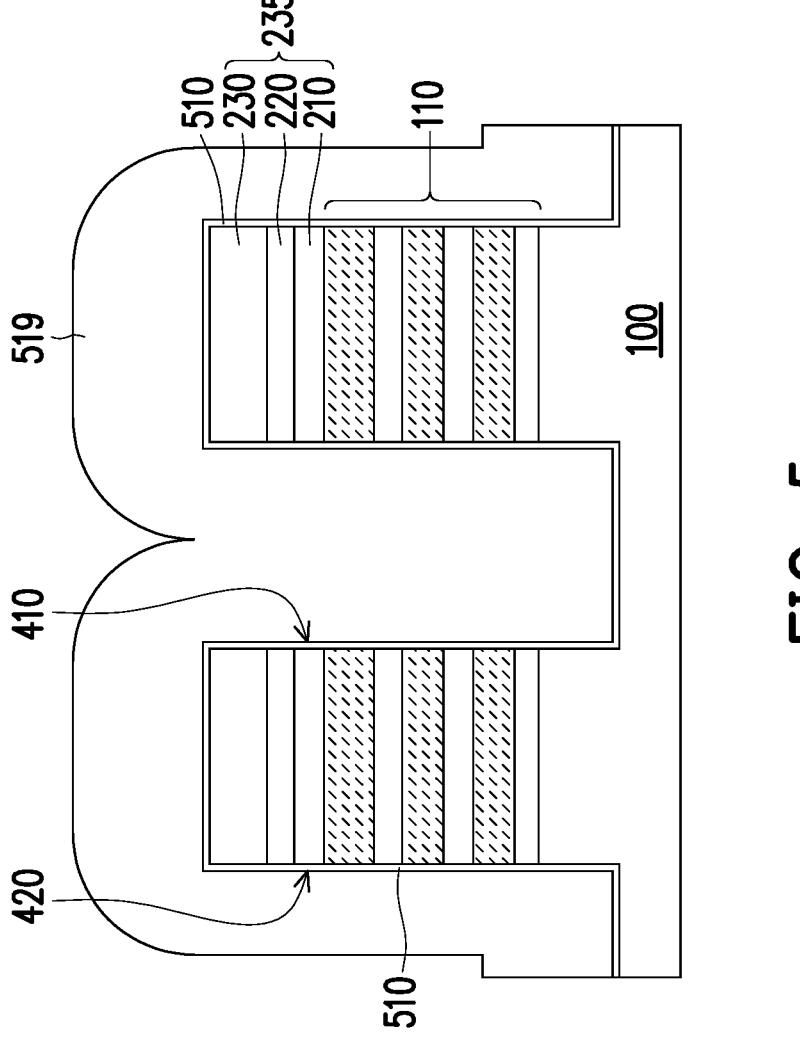

Referring to FIG. 5, in some embodiments, a liner 510 is formed over the substrate 100, and a dielectric wall material 519 is formed over the liner 510 and filling in the trenches 410 and 420. In some embodiments, the liner 510 is conformally deposited over the substrate 100 covering the mask pattern 235 and the patterned stacks 110 and the trenches 410 and 420. In some embodiments, the material of the liner 510 includes SiN, SiCN, SiOCN, SiON, or combinations thereof. In some embodiments, a thickness of liner 150 is between 1 nm to 5 nm, or the thickness of liner 150 is between 2 nm to 3 nm. In some embodiments, the dielectric wall material 519 includes silicon nitride (SiN), silicon carbonitride (SiCN), silicon oxide such as silicon dioxide ($SiO_2$), carbon-containing oxide such as silicon oxycarbide (SiOC), nitrogen-containing oxide such as silicon oxynitride (SiON), carbon-containing and nitrogen-containing oxide such as silicon oxycarbonitride (SiOCN), or combinations thereof, a high-K dielectric material and/or other suitable insulating dielectric material. For example, the high-K dielectric material includes hafnium oxide ($HfO_2$), tantalum pentoxide ($Ta_2O_5$), titanium dioxide ($TiO_2$), zirconium dioxide ($ZrO_2$), aluminum oxide ($Al_2O_3$), yttrium oxide ($Y_2O_3$), lanthanum doped, or combinations thereof. In some embodiments, the dielectric constant (k-value) of the high-k dielectric material is higher than 3.9, and may be higher than about 7.0. In various examples, the dielectric wall material 519 is formed by performing a CVD process (such as plasma enhanced CVD (PECVD), sub-atmospheric CVD (SACVD), or flowable CVD), an ALD process, or other suitable deposition process. In some embodiments, the dielectric wall material 519 includes a single layer of a dielectric material or a composite layer of multiple dielectric materials.

Figures 6A, 6B:
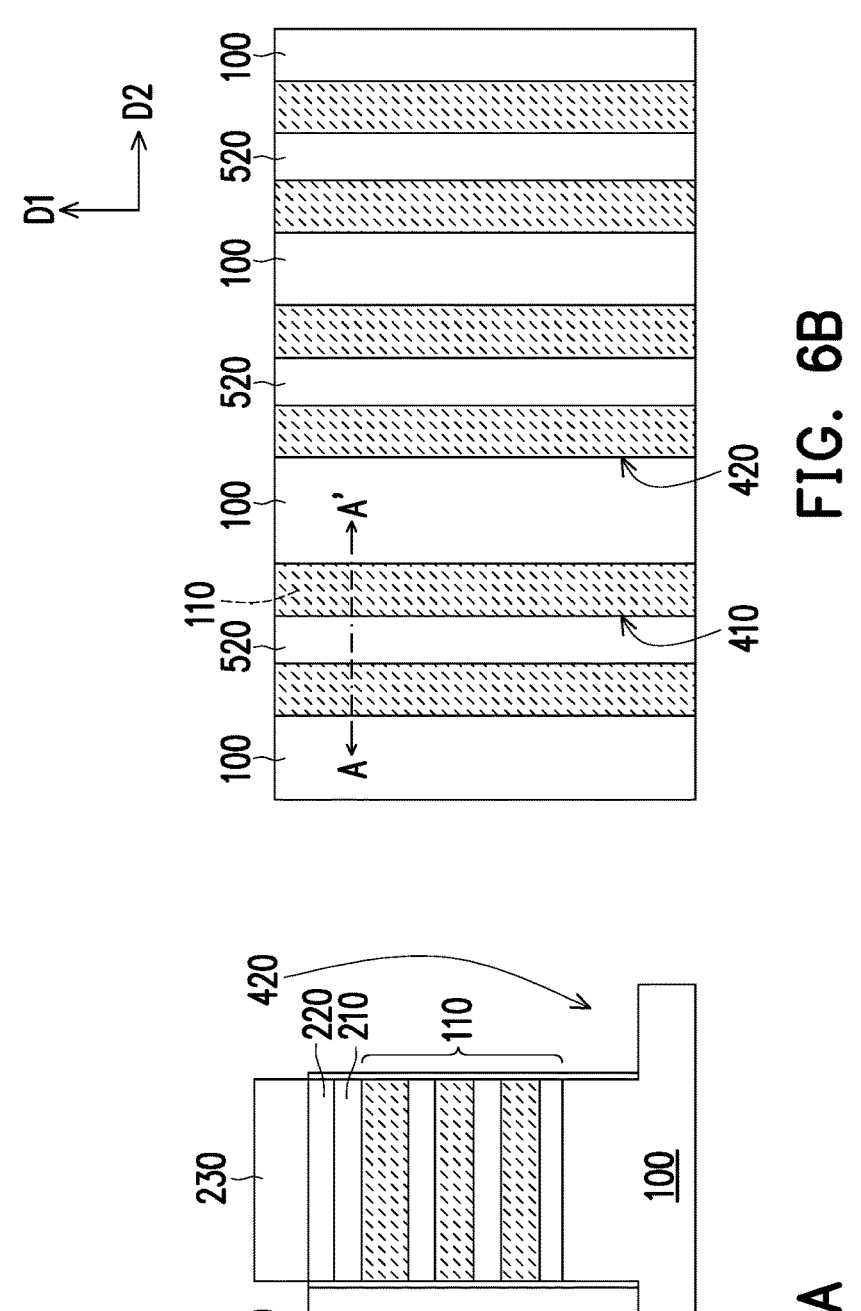

FIG. 6B is a schematic plane view showing an exemplary structure of the semiconductor device according to some embodiments of the present disclosure. FIG. 6A is a schematic cross-sectional view illustrating a cross-section of the exemplary structure as shown in FIG. 6B along the cross-section line A-A'. Referring to FIGS. 6A and 6B, following the process depicted in FIG. 5, in some embodiments, an etch back process is performed to the dielectric wall material 519 and the liner 510 to form the dielectric walls 520 within the trenches 410 with recessed liner 510 located on the sidewalls of the trenches 410. During the etching back process, the dielectric wall material 519 outside the trenches 410 is removed and the trenches 420 are exposed, and the liner 510 is recessed down to form the recessed liner 510 on the sidewalls of the patterned stacks 110 surrounding the patterned stacks 110. The recessed liner 510 is omitted in the schematic plane view of FIG. 6B for simplicity. As seen in FIG. 6A, the dielectric wall 520 is lower than the hard mask layer 230. Referring to FIG. 6A and FIG. 6B, for each dielectric wall 520, the stacks 110 beside and located at opposite sides of each dielectric wall 520 may later be respectively fabricated into an n-type transistor and a p-type transistor. Hence, the dielectric wall 520 separating the stacks 110 at two opposite sides (the stack pair) serve as an insulator (also an etch stop) between later formed n-type and p-type transistors. In some embodiments, etching back process includes at least one dry etching process. In some implementations, the etching back process includes performing a dry etching process using fluorine-based etchants such as hydrogen fluoride (HF), nitrogen trifluoride ($NF_3$), fluorine gas ($F_2$), hexafluorobutadiene ($C_4F_6$), tetrafluoromethane (CF$_4$), trifluoromethane (CHF$_3$), difluoromethane (CH$_2$F$_2$), hydrogen bromide (HBr), chlorine-based etchants such as chlorine (Cl$_2$), boron trichloride (BCL$_3$), silicon chloride (SiCl$_4$), and/or hydrogen (H$_2$), ammonia (NH$_3$).

Figure 7:
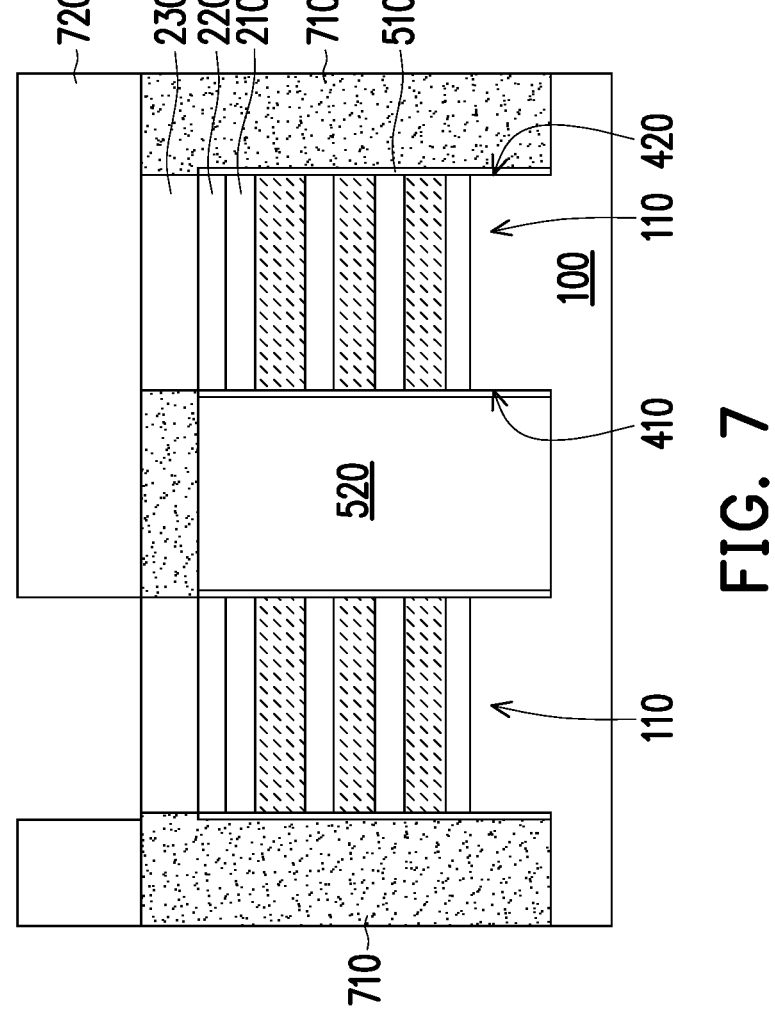

Referring to FIG. 7, in some embodiments, a sacrificial layer 710 is formed over the substrate 100 filling up the trenches 420 and covering the dielectric walls 520. Afterwards, the sacrificial layer 710 is planarized by a planarization process to level with the hard mask layer 230. Then, a photoresist pattern 720 is formed on the planarized sacrificial layer 710 and the hard mask layer 230. For example, the planarization process includes a chemical mechanical planarization (CMP) process.

Figure 8:
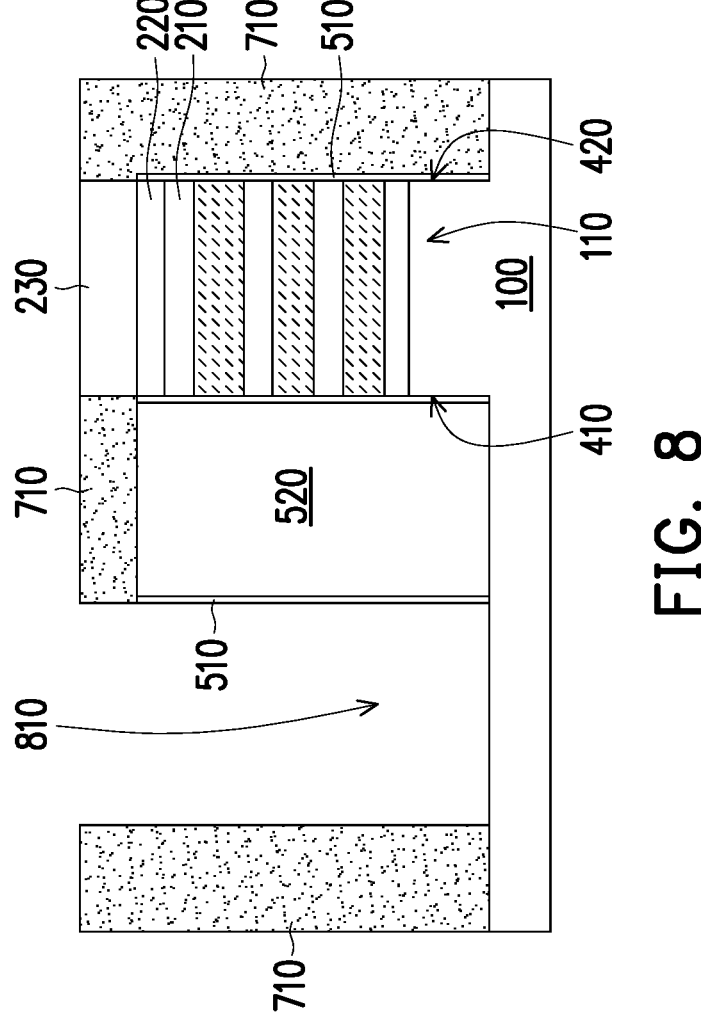

Referring to FIG. 8, in some embodiments, a portion of the stacks 110 is removed by using the photoresist pattern 720 as an etching mask, and at least one trench 810 is formed. And then, the photoresist pattern 720 is removed. In some embodiments, the etching processes include dry etching processes, wet etching processes, or a combination thereof.

Figures 9A, 9B:
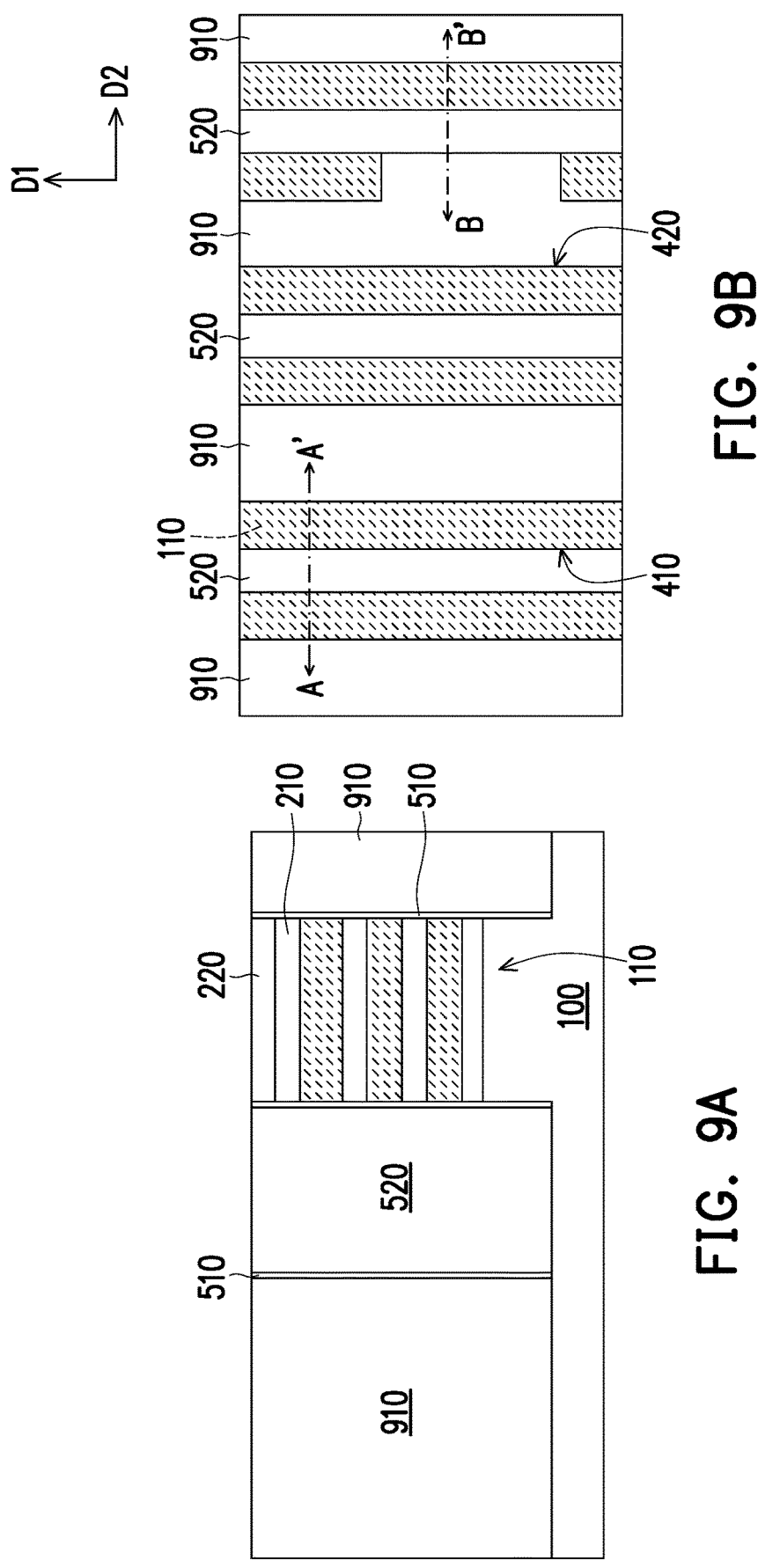

FIG. 9B is a schematic plane view showing an exemplary structure of the semiconductor device according to some embodiments of the present disclosure. FIG. 9A is a schematic cross-sectional view illustrating a cross-section of the exemplary structure as shown in FIG. 9B along the cross-section line B-B'. Referring to FIG. 9A and FIG. 9B, following the process depicted in FIG. 8, in some embodiments, the hard mask layer 230 and the sacrificial layer 710 (shown in FIG. 8) are removed, while the dielectric walls 520 are remained. After removing the sacrificial layer 710, as seen in FIG. 9B, the trench 810 is joined with the adjacent trench 420, and one stack 110 is fragmented into at least two segments via the formation of the trench 810 (FIG. 8). Later, isolation features 910 are formed by filling into the trenches 420 to define the active regions for the device. The isolation features 910 may include shallow trench isolation (STI) structures. In some embodiments, the formation of the isolation features 910 involves forming one or more dielectric materials, such as silicon dioxide (SiO) and/or silicon nitride (SiN), into the trenches 420 over the substrate 100 and filling up the trenches 420 and later performing a planarization process to level with the top of the pad nitride layer 220. In some embodiments, the dielectric material is deposited by CVD (such as plasma enlarged CVD (PECVD)), spin coating, thermal oxidation, or other techniques. In some embodiments, the planarization process includes a chemical mechanical polishing (CMP) process.

Figure 10:
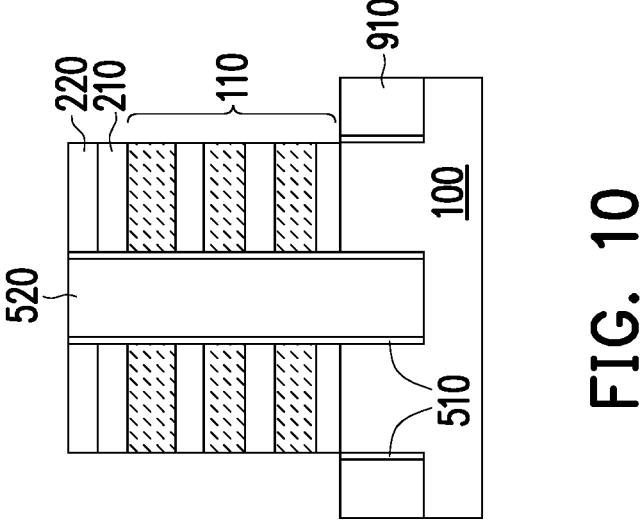

FIG. 10 is a schematic cross-sectional view illustrating the exemplary structure along the cross-section line A-A' following the process depicted in FIG. 9A and FIG. 9B. Referring to FIG. 10, in some embodiments, the isolation features 910 are further recessed to be lower than the patterned stacks 110 to expose the sidewalls of the patterned stacks 110. In some embodiments, the isolation features 910 are lower than the bottoms of the patterned stacks 110 so that the sidewalls of the patterned stacks 110 are fully exposed.

Figure 11:
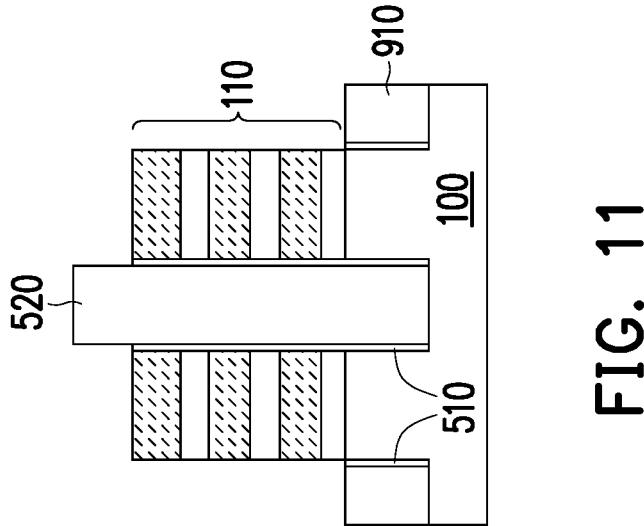

Referring to FIG. 11, in some embodiments, the pad oxide layer 210 and the pad nitride layer 220 are removed using a plasma etching process, and/or a wet etching process.

Figure 12:
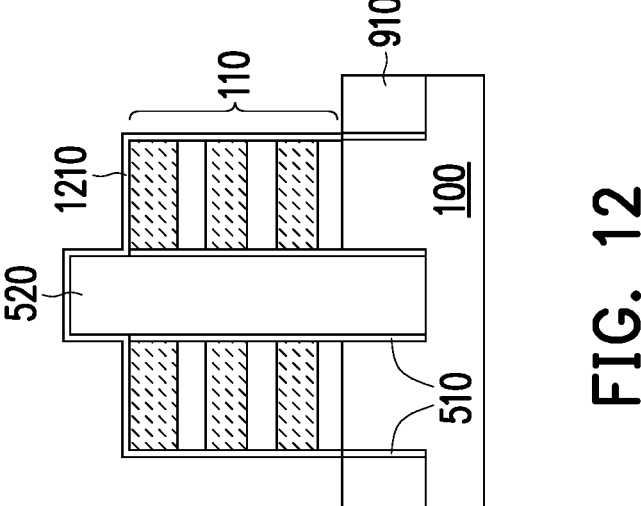

Referring to FIG. 12, in some embodiments, a dummy oxide layer 1210 is conformally formed over the stacks 110 and covering the surfaces of the stacks 110. In some embodiments, the dummy oxide layer 1210 includes silicon oxide formed by thermal oxidation. In some embodiments, a thickness of the dummy oxide layer 1210 is between 1 nm to 5 nm, or the thickness of the dummy oxide layer 1210 is between 2 nm to 3 nm.

Figures 13A, 13B:
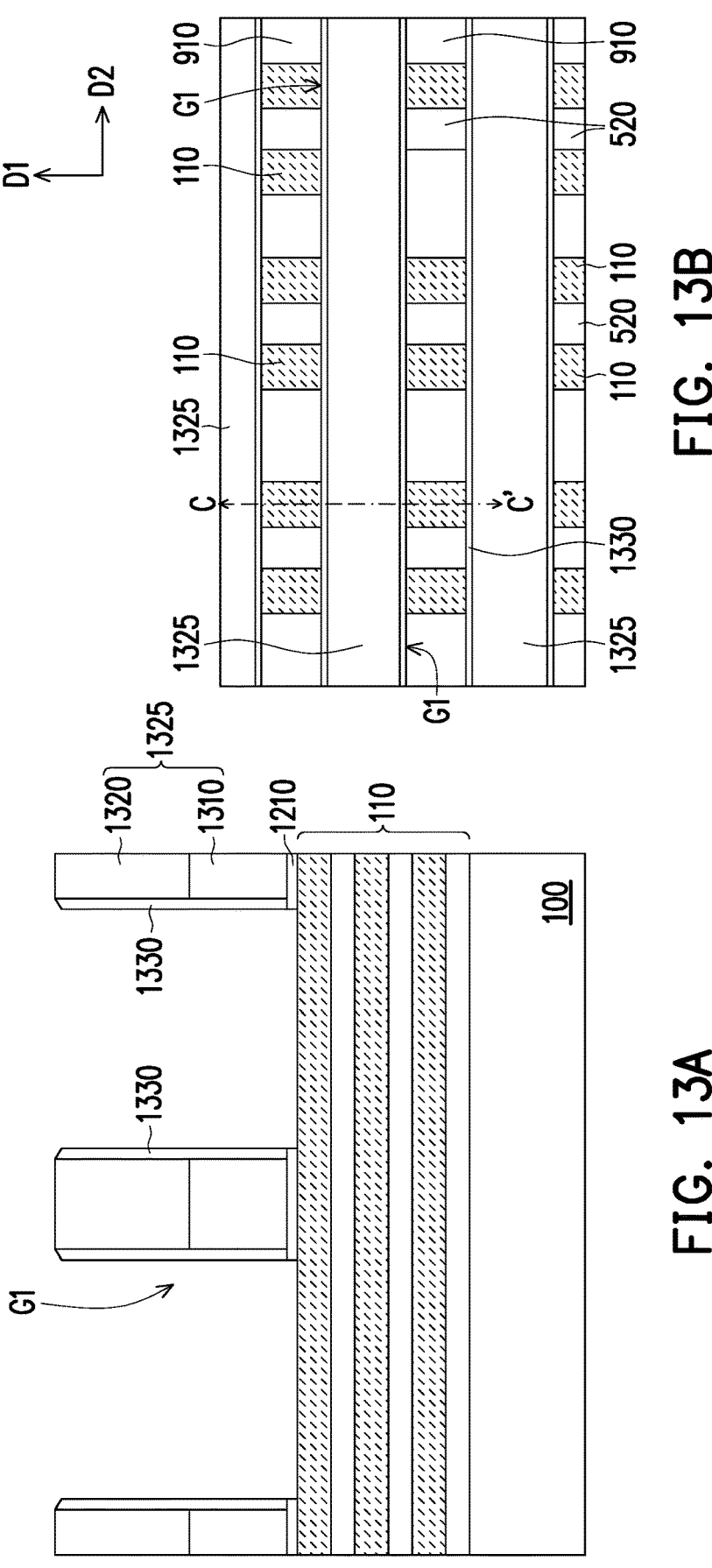

FIG. 13B is a schematic plane view showing an exemplary structure of the semiconductor device according to some embodiments of the present disclosure. FIG. 13A is a schematic cross-sectional view illustrating a cross-section of the exemplary structure as shown in FIG. 13B along the cross-section line C-C'. Referring to FIGS. 13A and 13B, following the process depicted in FIG. 12, in some embodiments, dummy strips 1325 each including a dummy gate strip 1310 and a hard mask strip 1320 are formed on and across the patterned stacks 110 over the substrate 100. In some embodiments, in FIG. 13B, the patterned stacks 110 extend in parallel along the first direction D1, while the dummy strips 1325 extend in parallel along the second direction D2 perpendicular to the first direction D1. In FIG. 13B, between the parallel dummy strips 1325, trenches G1 are formed to expose the underlying stacks 110. Later, sidewall spacers 1330 are formed on the sidewalls of the dummy strips 1325. In some embodiments, the formation of the sidewall spacers 1330 involves globally forming a spacer material (not shown) over the substrate 100 covering the dummy strips 1325 and the exposed stacks 110 and the isolation features 910, and later the spacer material on the exposed stacks 110 and the isolation features 910 is removed to form the sidewall spacers 1330. In some embodiments, the dummy gate strips 1310 and the hard mask strips 1320 are formed through various process steps including layer deposition and patterning. For example, the patterning process includes a lithography process (e.g., photolithography or e-beam lithography) which further includes photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the material of the dummy gate strips 1310 includes polycrystalline silicon (polysilicon). In some embodiments, the material of the hard mask strips 1320 includes silicon oxide, silicon nitride, silicon oxynitride, silicon carbide or a combination thereof. In some embodiments, the spacer material for forming the sidewall spacers 1330 is deposited conformally covering top surfaces and sidewalls of the dummy gate strips 1310 and the hard mask strips 1320. The term "conformally" may be used herein for ease of description of a layer having substantially uniform thickness over various regions. In some embodiments, the sidewall spacer 1330 includes a single-layer structure or a multiple-layered structure. In some embodiments, the spacer material of the sidewall spacers 1330 includes silicon carbonitride, silicon oxycarbide, silicon oxycarbonitride, or silicon nitride. In some embodiments, the spacer material is deposited over the substrate 100 using CVD (e.g. sub-atmospheric CVD (SACVD)) or ALD.

Figure 14:
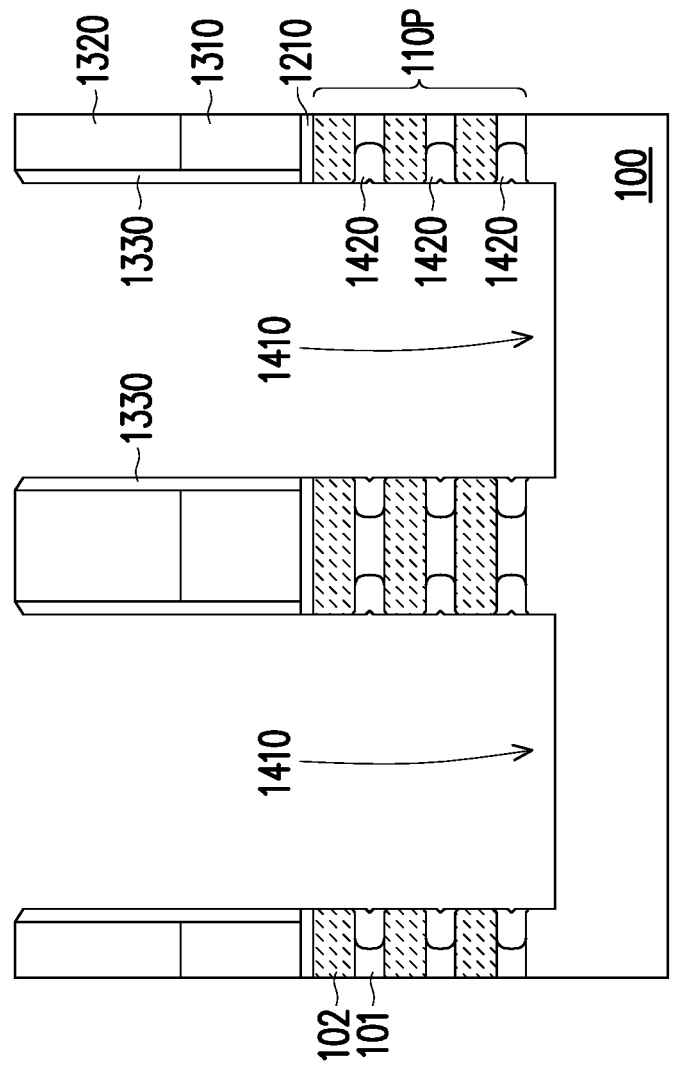

Referring to FIG. 14, in some embodiments, using the dummy strips 1325 and the sidewall spacers 1330 as the masks, the stacks 110 are patterned into the stacks 110P with openings 1410 there-between. In some embodiment, portions of the stacks 110 that are not covered by the dummy strips 1325 are removed to form the openings 1410. That is, the stacks 110 that are exposed by the trenches G1 are etched off to form the block stacks 110P. As the openings 1410 will accommodate later formed source/drain features and may be referred to as source/drain recess openings 1410. Later, inner spacers 1420 are formed in the epitaxy layers 101 of the stacks 110P. In some embodiments, the formation of the inner spacers 1420 involves laterally etching the sacrificial epitaxy layers 101 exposed by the source/drain recess openings 1410 to form recesses and forming the inner spacers 1420 filling up the recesses. In some embodiments, a thickness of the sidewall spacers 1330 ranges from 3 nm to 8 nm. In some embodiments, the epitaxy channel layers 102 include silicon and the sacrificial epitaxy layers 101 include silicon germanium (SiGe), and the formation of the inner spacers 1420 involves selectively recessing silicon germanium of the sacrificial epitaxy layers 101. In some embodiments, the material of the inner spacers 1420 includes silicon oxide, silicon oxycarbonitride, silicon nitride, silicon oxynitride, silicon carbonitride, or a low-k dielectric material. In some embodiments, the material of the inner spacers 1420 includes aluminum oxide, zirconium oxide, tantalum oxide, yttrium oxide, titanium oxide, lanthanum oxide, or combinations thereof. In some embodiments, the inner spacers 1420 are formed using CVD, PECVD, LPCVD, ALD or other suitable methods.

Figure 15:
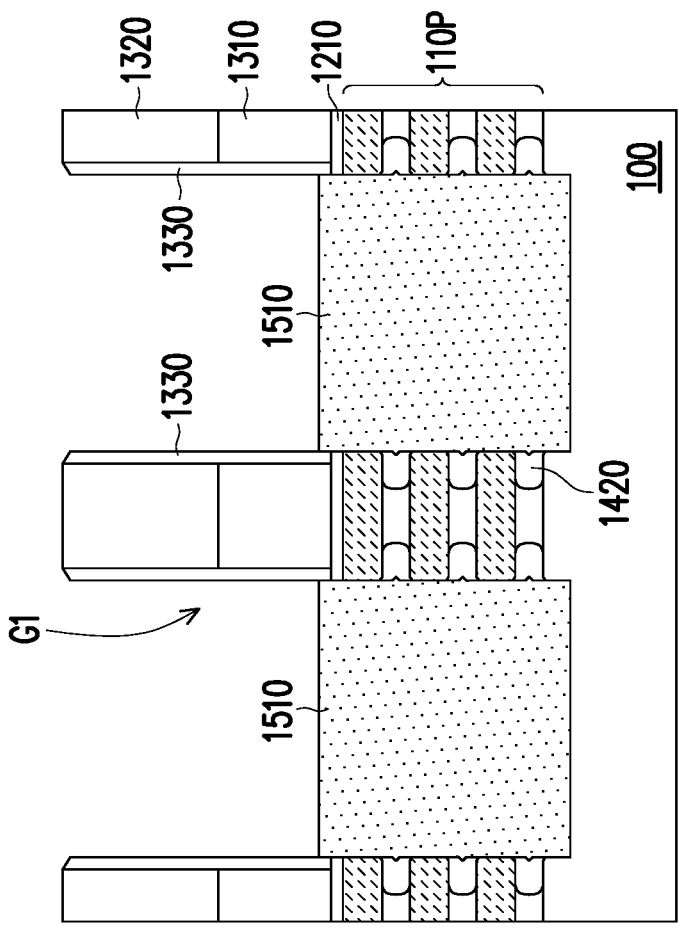

Referring to FIG. 15, in some embodiments, source/drain features 1510 are formed in the source/drain recess openings 1410 by epitaxial growth processes. Suitable epitaxial growth processes include CVD deposition techniques (e.g., vapor-phase epitaxy (VPE) and/or ultra-high vacuum CVD (UHV-CVD)), molecular beam epitaxy (MBE), and/or other suitable processes. In some embodiments, the source/drain features 1510 includes silicon or silicon germanium doped with suitable dopants. In some alternative embodiments, the source/drain features 1510 are in contact with the inner spacers 1420 and the channel layers 102.

Figure 16:
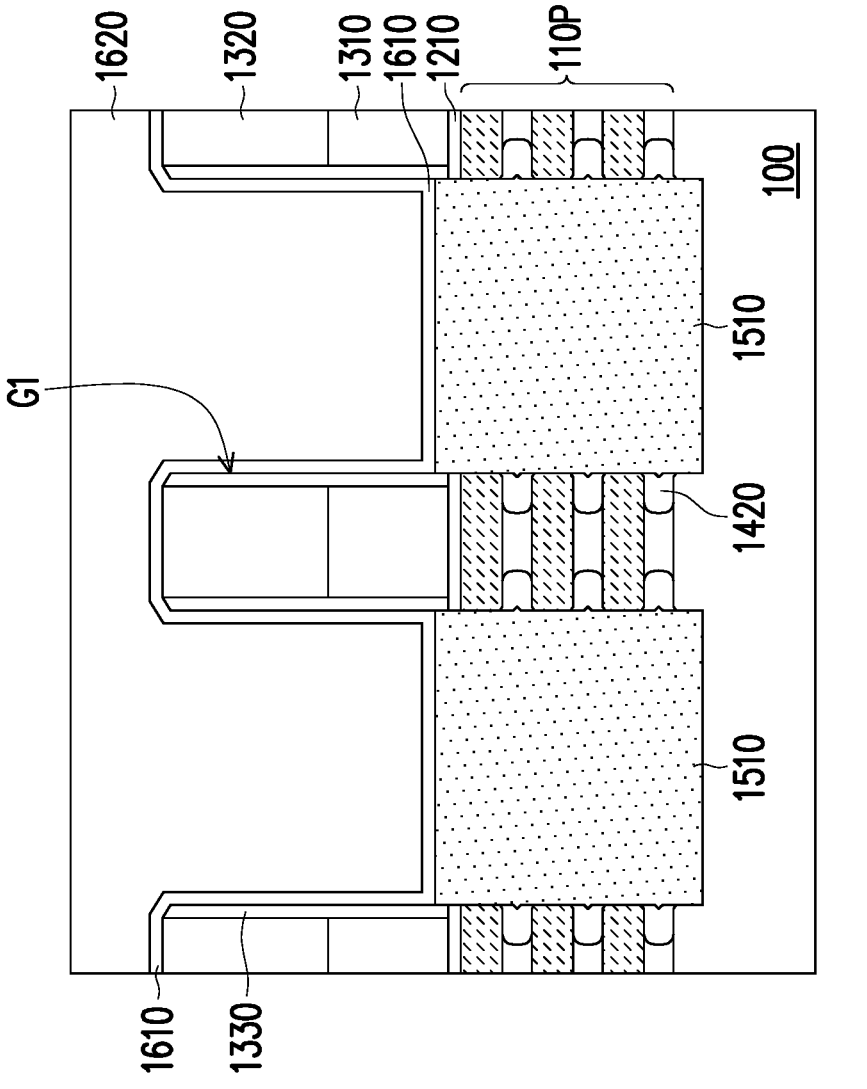

Referring to FIG. 16, in some embodiments, an etching stop layer (ESL) 1610 is formed conformally over the substrate 100 and covering the source/drain features 1510, the dummy strips 1325 and the sidewall spacers 1330. Later, a first interlayer dielectric (ILD) layer 1620 is formed over the etching stop layer 1610 and filling up the trenches G1 between the sidewall spacers 1330 and above the source/drain features 1510. In some examples, the material of the etching stop layer 1610 includes silicon nitride, silicon oxide, silicon oxynitride, and/or other dielectric materials. The etching stop layer 1610 is formed by ALD, PECVD and/or other suitable deposition processes. In some embodiments, the material of the ILD layer 1620 includes silicon oxide formed from using tetraethylorthosilicate (TEOS), un-doped silicate glass, or doped silicate glass such as borophosphosilicate glass (BPSG), fused silica glass (FSG), phosphosilicate glass (PSG), boron doped silicon glass (BSG), and/or other suitable low-k dielectric materials. In some embodiments, the first ILD layer 1620 is deposited by CVD such as PECVD or other suitable deposition technique. As shown in FIG. 16, in some embodiments, the etching stop layer 1610 conformally covers the sidewall spacers 1330 and is formed directly on top surfaces of the source/drain features 1510.

Figure 17:
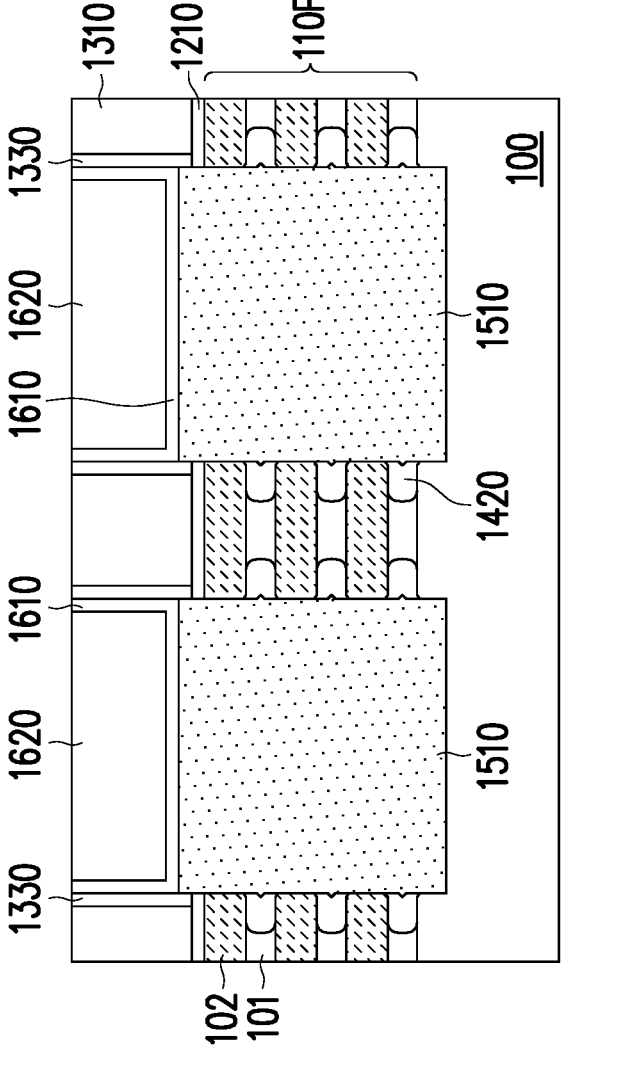

Referring to FIG. 17, in some embodiments, the structure is planarized by a planarization process to expose the dummy gate strips 1310. For example, the planarization process includes a chemical mechanical planarization (CMP) process. Through the planarization process, the hard mask strips 1320 are removed and portions of the sidewall spacers 1330 are removed, and tops of the planarized etch stop layer 1610 and the shorted spacers 1330 and the top surface the planarized ILD layer 1620 are coplanar and levelled with the top surfaces of the dummy gate strips 1310.

Figure 18B:
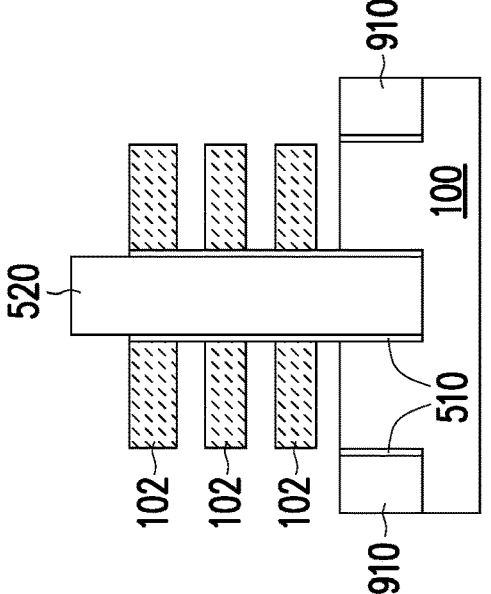
Figure 18A:
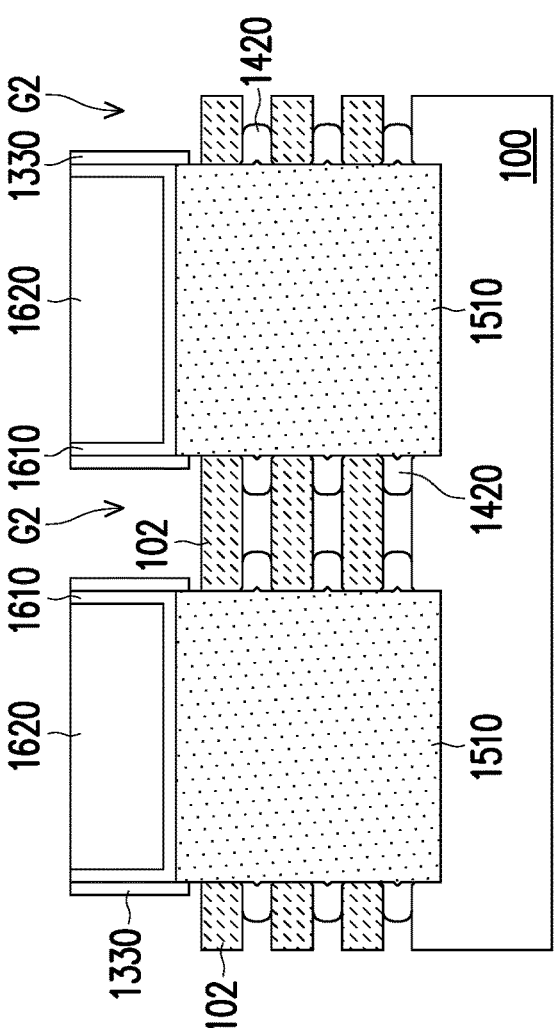
Figure 18C:
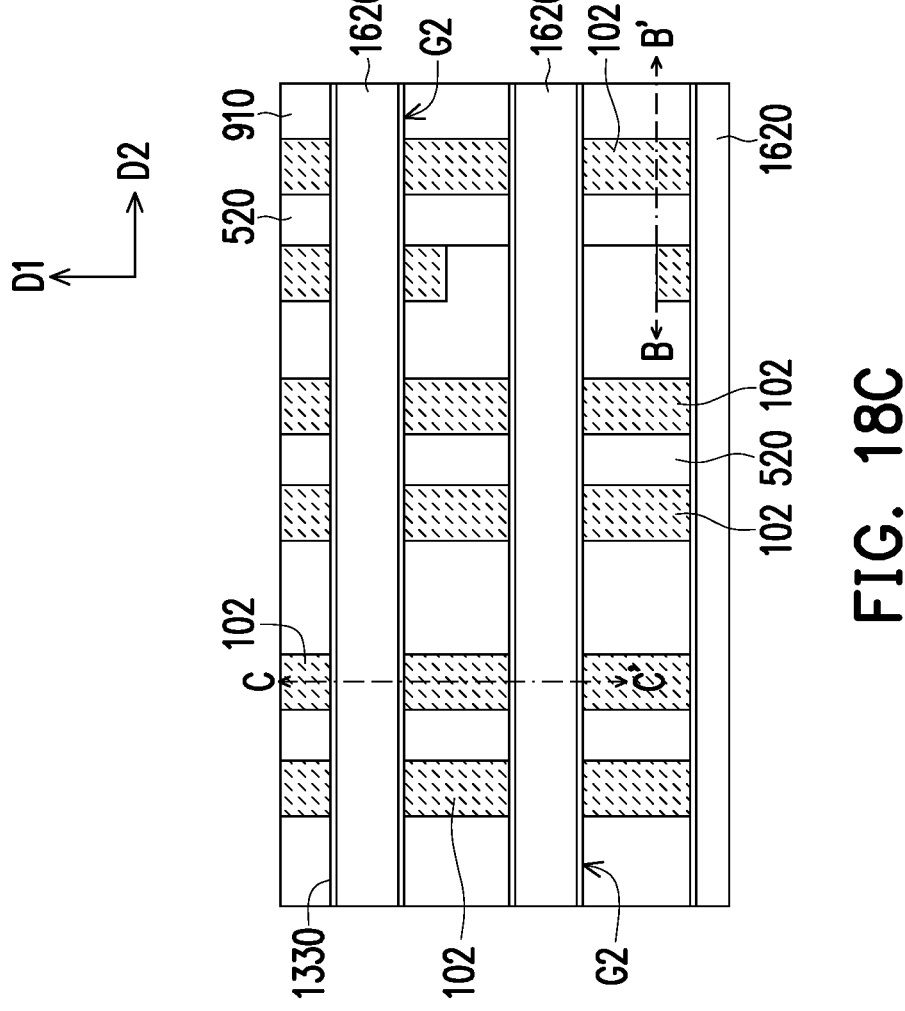

FIG. 18C is a schematic plane view showing an exemplary structure of the semiconductor device according to some embodiments of the present disclosure. FIG. 18A is a schematic cross-sectional view illustrating a cross-section of the exemplary structure as shown in FIG. 18C along the cross-section line C-C'. FIG. 18B is a schematic cross-sectional view illustrating a cross-section of the exemplary structure as shown in FIG. 18C along the cross-section line B-B'.

Referring to FIGS. 18A and 18B, following the process depicted in FIG. 17, in some embodiments, the dummy gate strips 1310 and the dummy oxide layer 1210 are removed, and the underlying sacrificial epitaxy layers 101 are also removed. In some embodiments, the removal of the dummy gate strips 1310 and the dummy oxide layer 1210 along with the removal of the epitaxy layers 101 result in gate trenches G2 over the channel regions. In some embodiments, the removal of the dummy gate strips 1310 and the dummy oxide layer 1210 includes performing one or more etching processes that are selective to the materials of the dummy gate strips 1310 and the dummy oxide layer 1210. In some embodiments, the removal of the epitaxy layers 101 includes performing one or more selective etching processes to selectively remove the epitaxy layers 101 without damaging the epitaxy layers 102. After the removal of the dummy gate strips 1310 and the dummy oxide layer 1210 and the epitaxy layers 101, surfaces of the epitaxy layers 102, functioning as channel regions, are exposed. As seen in FIG. 18C, the gate trenches G2 are sandwiched between the sidewall spacers 1330 and the first ILD layers 1620. In FIG. 18C, the etch stop layer 1610 is omitted for simplicity.

Figure 19B:
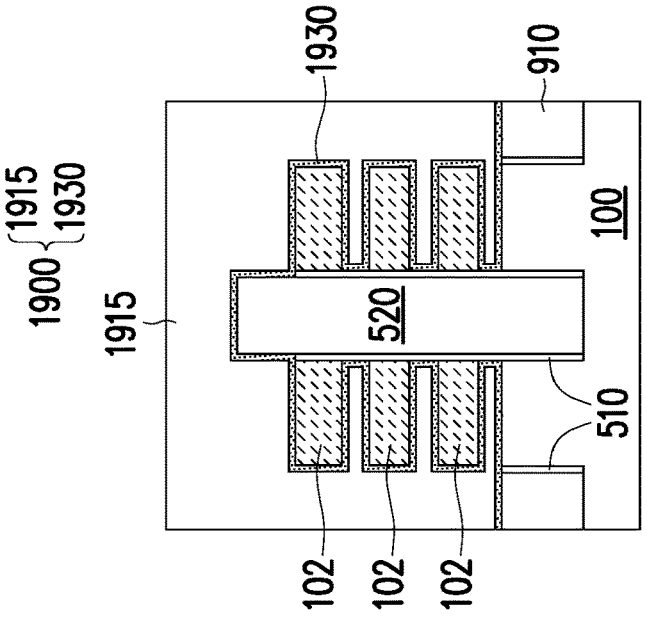
Figure 19A:
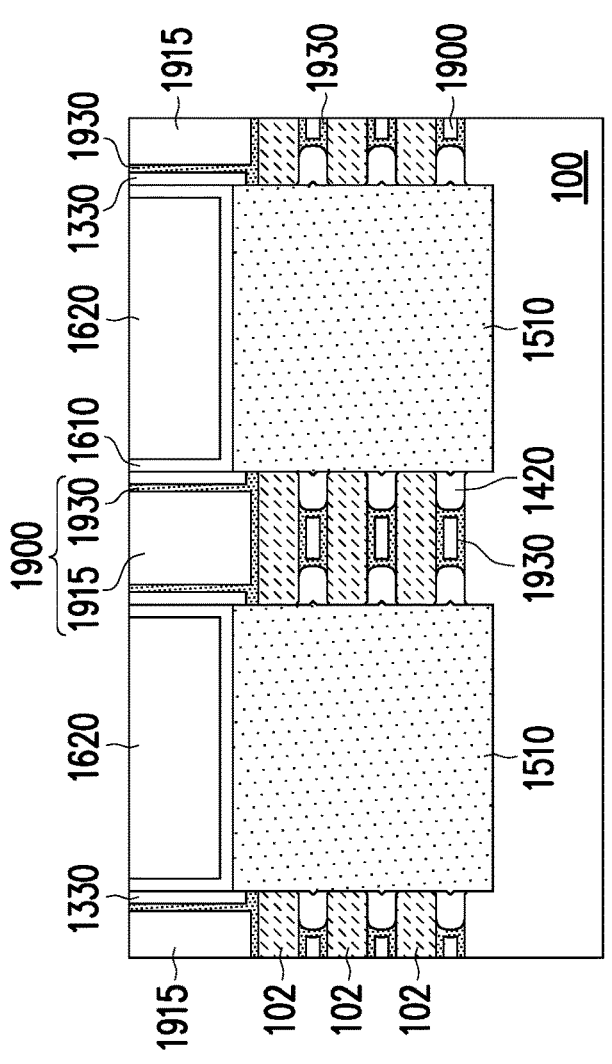

FIG. 19A is a schematic cross-sectional view illustrating a cross-section of the exemplary structure along the cross-section line C-C' in FIG. 18C after the process depicted in FIG. 18A. FIG. 19B is a schematic cross-sectional view illustrating a cross-section of the exemplary structure along the cross-section line B-B' in FIG. 18C after the process depicted in FIG. 18B.

Figures 20A, 20B:
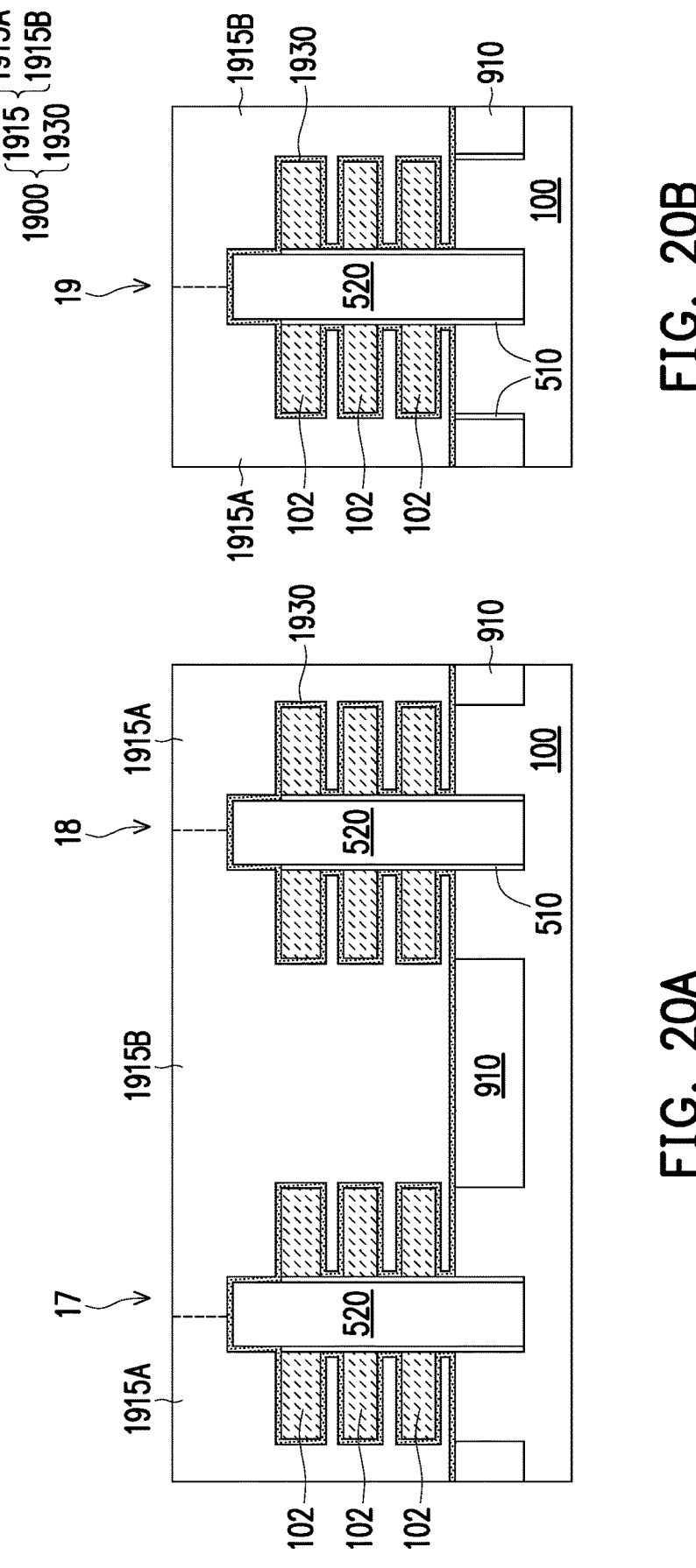
Figure 20C:
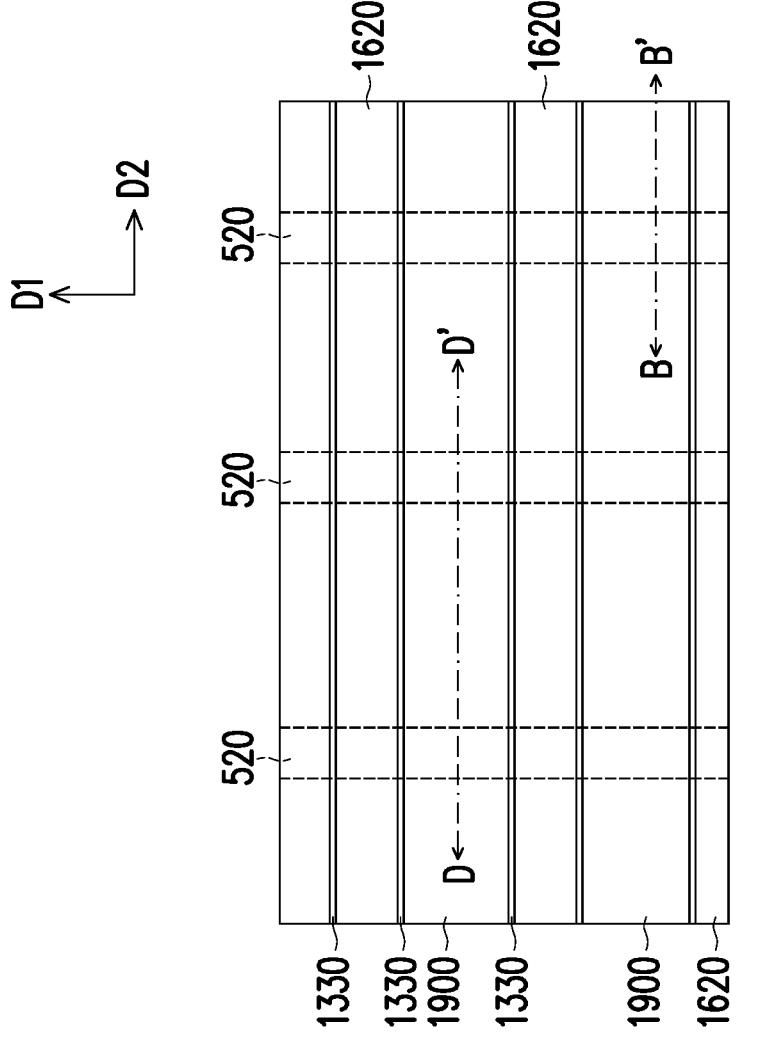

FIG. 20C is a schematic plane view showing an exemplary structure of the semiconductor device according to some embodiments of the present disclosure. FIG. 20A is a schematic cross-sectional view illustrating a cross-section of the exemplary structure as shown in FIG. 20C along the cross-section line D-D'. FIG. 20B is a schematic cross-sectional view illustrating a cross-section of the exemplary structure as shown in FIG. 20C along the cross-section line B-B'.

Referring to FIGS. 19A and 19B, following the process depicted in FIG. 18A and FIG. 18B, in some embodiments, gate structures 1900 are subsequently formed in the gate trenches G2, as will be described below. In some embodiments, the method includes further operations to form the gate structure 1900 wrapping around each of the released channel layers 102. In some embodiments, the gate structure 1900 includes a metal gate structure. In some embodiments, the gate structure 1900 is formed within the gate trench G2 and into the space left behind by the removal of the sacrificial layers 101. In this regard, the gate structure 1900 wraps around each of the channel layers 102. In some embodiments, the gate structure 1900 includes a high-k gate dielectric layer 1930 and a metal electrode 1915. In some embodiments, the high-k gate dielectric layer 1930 includes one or more layers of a high-k dielectric material, such as hafnium oxide, HfSiO, HfSiON, HfTaO, HfTiO, HfZrO, zirconium oxide, aluminum oxide, titanium oxide, hafnium dioxide-alumina alloy, other suitable high-k dielectric materials, and/or combinations thereof. In some embodiments, the high-k dielectric layer 1930 is formed by CVD, ALD, or any suitable method. In some embodiments, the material of the metal gate electrode 1915 includes titanium (Ti), tungsten (W), vanadium (V), niobium (Nb), manganese (Mn), molybdenum (Mo), nitrides thereof or combinations thereof. In some embodiments, the material of the metal gate electrode 1915 includes titanium nitride (TiN). In some embodiments, the material of the metal gate electrode 1915 includes tungsten. For example, the metal gate electrode 1915 can be deposited using physical vapor deposition (PVD), ALD, CVD, or other suitable deposition processes. In some embodiments, the gate dielectric layer 1930 is formed conformally over the substrate 100, conformally covering the exposed epitaxy layers 102, the dielectric wall 520, and the isolation features 910. In some embodiments, a thickness of gate dielectric layer 1930 ranges from 5 nm to 15 nm. In some embodiments, the gate structures 1900 are formed by filling up the gate trenches G2 and the spaces between the epitaxy layers 102 and the inner spacers 1420. In some embodiments, a planarization process is optionally performed to remove the extra parts of the gate dielectric layer 1930 and the metal gate electrode 1915.

In some embodiments, referring to FIG. 20A and FIG. 20B, according to the n-type or p-type transistor to be formed in the respective side of the dielectric wall 520, the metal gate electrode 1915 of the gate structure 1900 is further doped with suitable dopants to form first gate electrode 1915A and second gate electrode 1915B at two sides of the dielectric wall 520. In some alternative embodiment, the first gate electrode 1915A and the second gate electrode 1915B are formed individually through different photomasks, and different metallic materials may be used to form the first and second metal gate electrodes 1915A and 1915B. Referring to FIG. 20A and FIG. 20B, the structure includes fork-sheet field effect transistors (FETs) 17, 18 and 19. It is understood that semiconductor device(s) may be other type of transistors such as gate all around FETs or nanosheet FETs. In some embodiments, separated by the dielectric wall structure 520, the fork-sheet FET 17, 18 or 19 includes a n-type transistor having the gate dielectric layer 1930 and the gate electrode 1915A wrapping around the channel layers 102 and a p-type transistor having the gate dielectric layer 1930 and the gate electrode 1915B wrapping around the channel layers 102. For example, the first gate electrode 1915A includes titanium nitride doped with aluminum, and the second gate electrode 1915B includes titanium nitride. It is understood that first gate electrode 1915A and the second gate electrode 1915B may be formed of different materials or have different types of dopants. Referring to FIG. 20C, the gate structures 1900 are sandwiched between the sidewall spacers 1330 and between the ILD strips 1620.

Figures 21A, 21B:
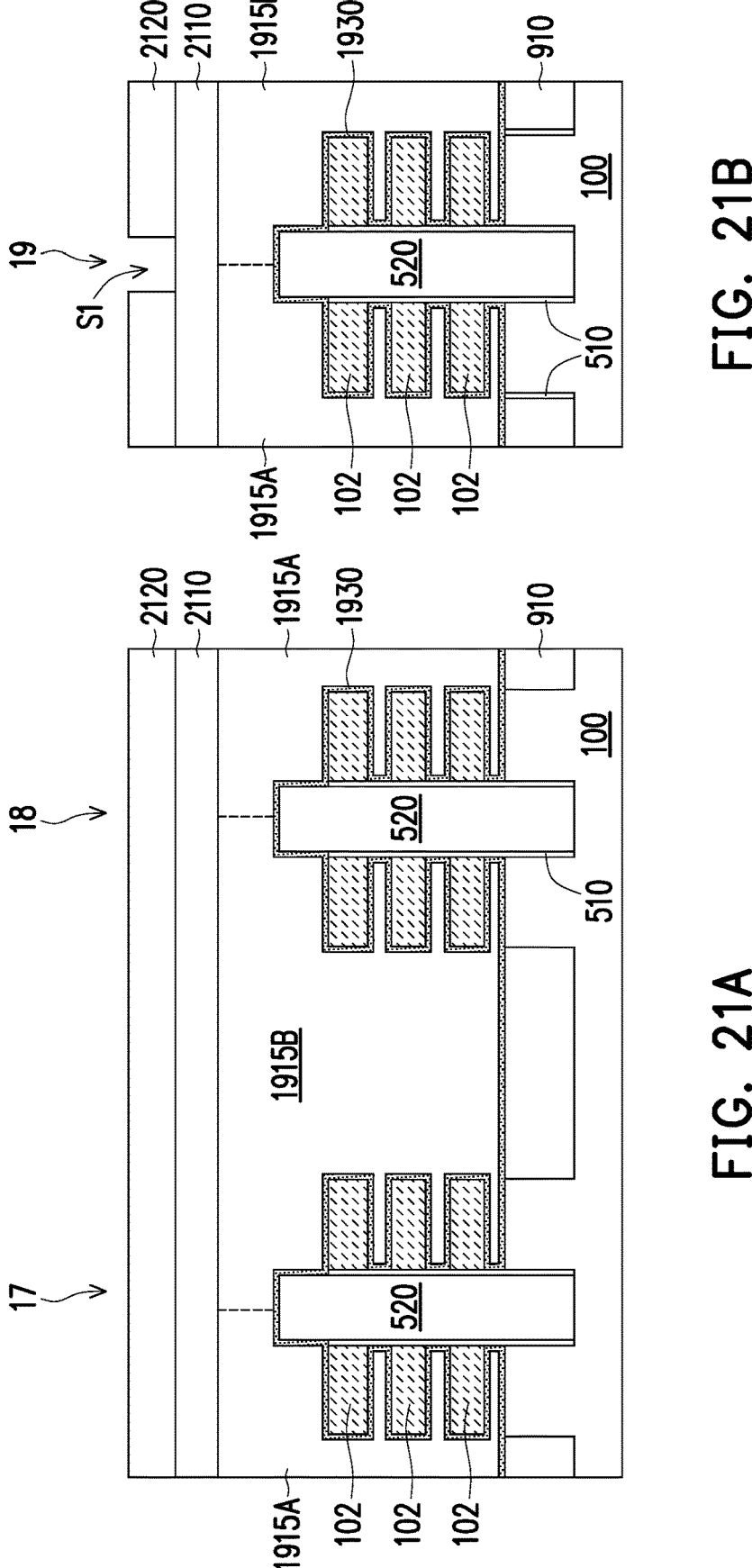

Following the process depicted in FIG. 20A and FIG. 20B, referring to FIGS. 21A and 21B, in some embodiments, a hard mask layer 2110 is formed on the gate structure 1900 and a photoresist pattern 2120 with slot openings S1 are formed on the hard mask payer 2110. In some embodiments, the photoresist pattern 2120 with the slot openings S1 is formed through a first photolithography and exposure process using a first photomask, the pattern of the first photomask is transferred and the photoresist pattern 2120 is formed with the slot openings S1. As seen in FIG. 21B, for the fork-sheet transistor structure 19, the slot opening S1 exposes a portion of the hard mask layer 2110, and the slot opening S1 is located above the gate structure 1900 and above the dielectric wall 520. In some embodiments, the first hard mask layer 2110 includes titanium nitride, silicon nitride, amorphous silicon, or other suitable hard mask material(s). In some embodiments, the hard mask layer 2110 is formed by CVD, ALD or other suitable deposition methods. The formation of the photoresist pattern 2120 is similar to the previously described photoresist pattern and details will be not repeated herein again.

Figures 22A, 22B:
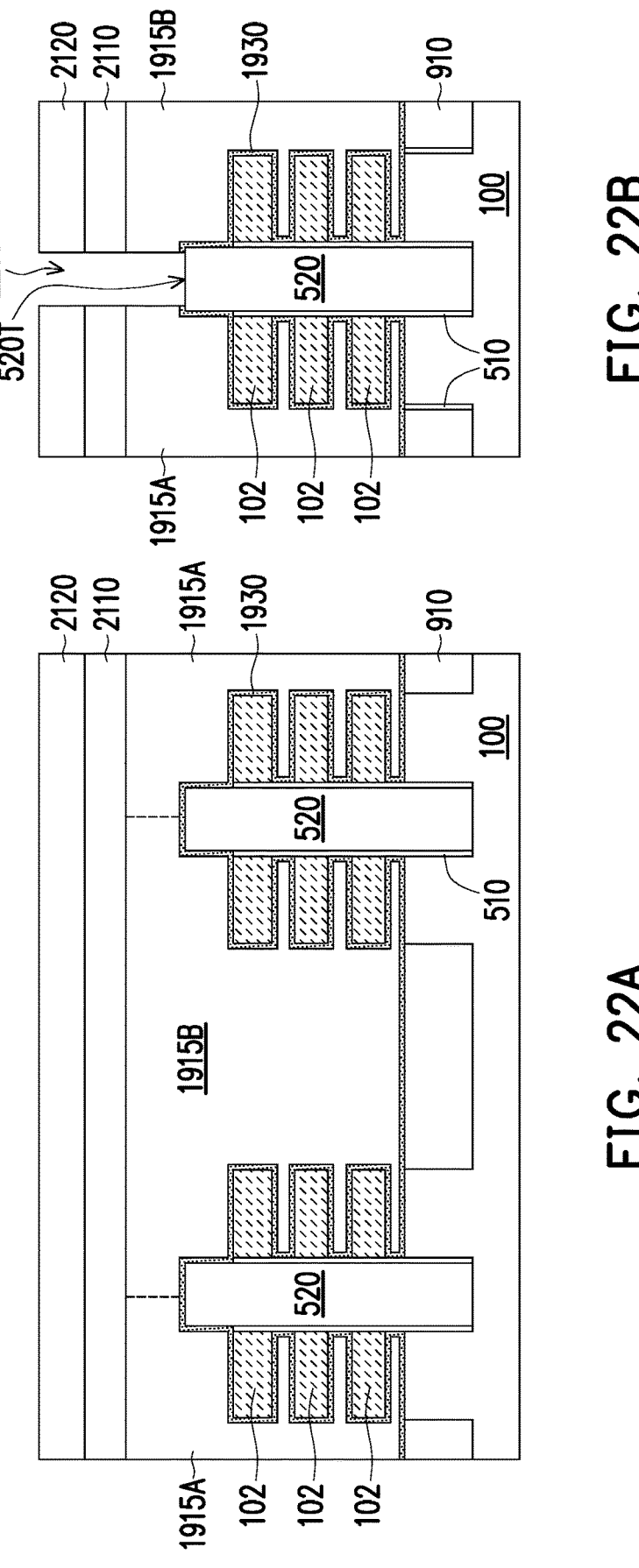

Referring to FIGS. 22A and 22B, in some embodiments, using the photoresist pattern 2120 as a mask and through the slot opening S1, the first hard mask layer 2110 and the gate structure 1900 are etched to form a trench 2210 exposing the dielectric wall 520. In some embodiments, the dielectric wall may function as an etch stop layer, so that the hard mask layer 2110, the metal gate electrode 1915 and the gate dielectric layer 1930 are removed through one or more etching processes until the top surface 520T of the dielectric wall 520 is exposed. That is, the trench 2210 penetrates through (cuts through) the gate structure 1900 and exposes the top surface 520T of the dielectric wall 520. In some embodiments, the etching process(es) includes reactive ion etching, or other suitable etching methods.

Figures 23A, 23B:
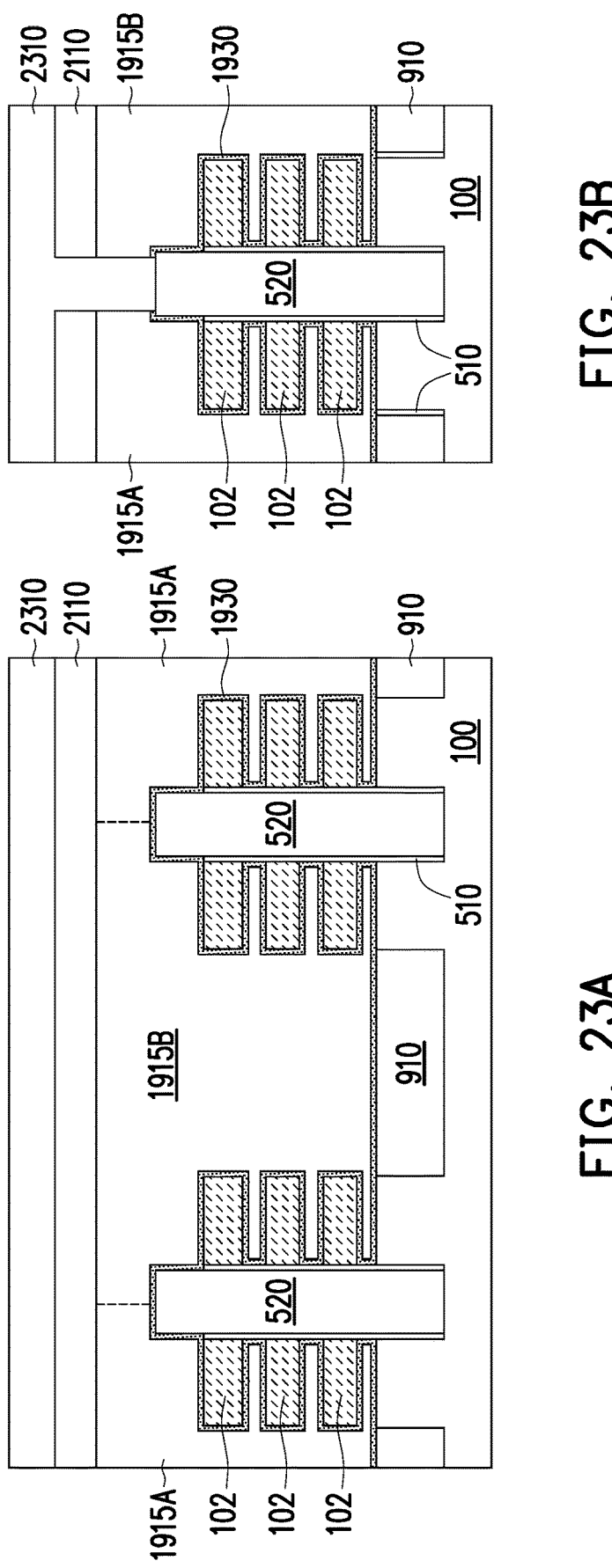

Referring to FIGS. 23A and 23B, in some embodiments, the photoresist pattern 2120 is removed, and a second hard mask layer 2310 is formed on the first hard mask layer 2110 and fills up the trench 2210. In some embodiments, the second hard mask layer 2310 includes titanium nitride, silicon nitride, amorphous silicon, or other suitable hard mask material(s). In some embodiments, the hard mask layer 2310 is formed by CVD, ALD or other suitable deposition methods. In an embodiment, the material of the hard mask layer 2310 is different to the material of the hard mask layer 2110.

Figures 24A, 24B:
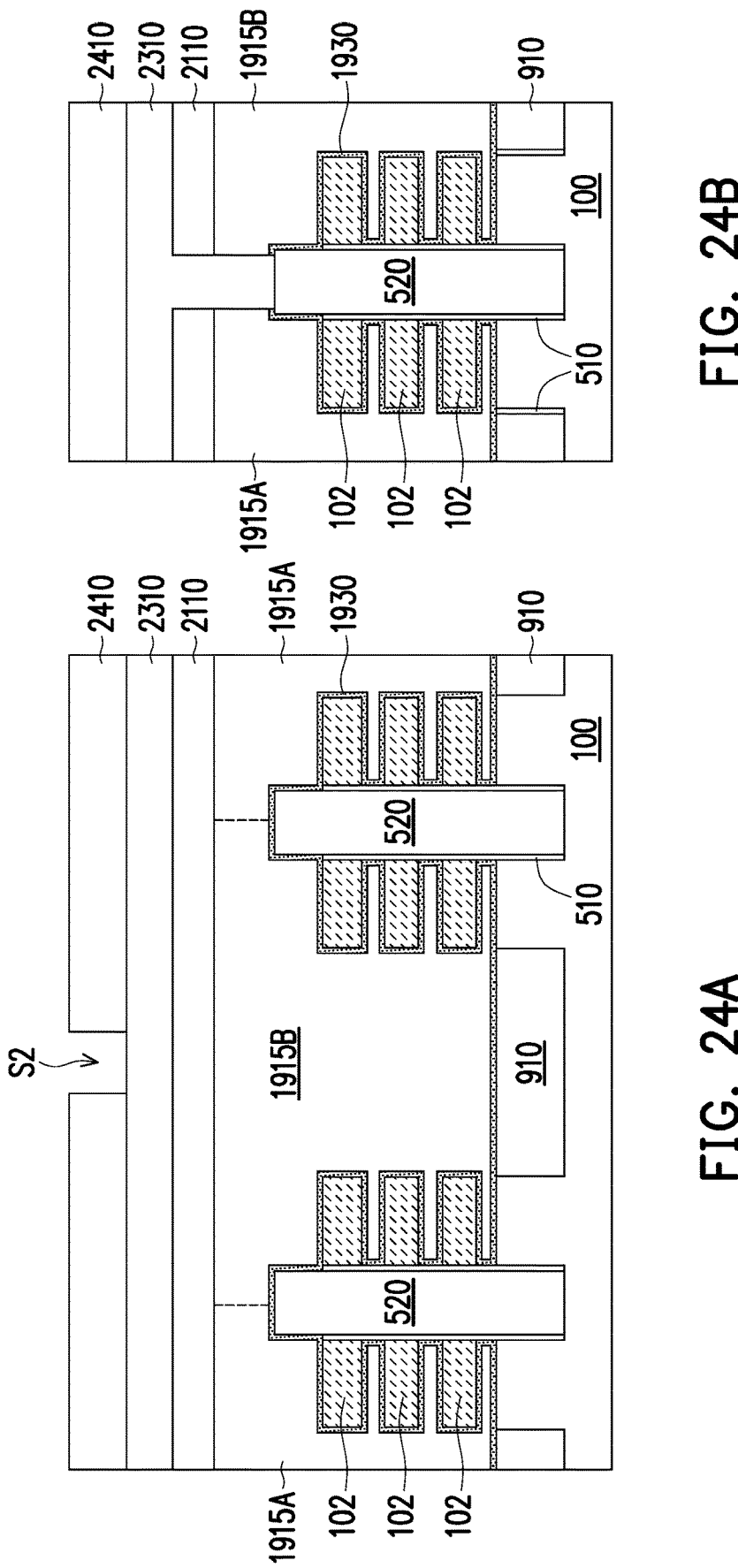

Referring to FIGS. 24A and 24B, in some embodiments, a photoresist pattern 2410 with trench opening S2 is formed on the second hard mask layer 2310. In some embodiments, the photoresist pattern 2410 with the trench opening S2 is formed through a second photolithography and exposure process using a second photomask, the pattern of the second photomask is transferred and the photoresist pattern 2410 is formed with the trench opening S2. The pattern of the first photomask is different from the pattern of the second photomask. Since the slot openings S1 and the trench opening S2 are individually formed, better depth control and opening profiles can be achieved through individual etching processes. The formation of the photoresist pattern is similar to the previously described photoresist pattern and details will be not repeated herein again. As seen in FIG. 24A, for the fork-sheet transistor structures 17 and 18, the trench opening S2 exposes a portion of the hard mask layer 2310, and the trench opening S2 is located above the gate structure 1900 and the isolation feature 910.

Figures 25A, 25B:
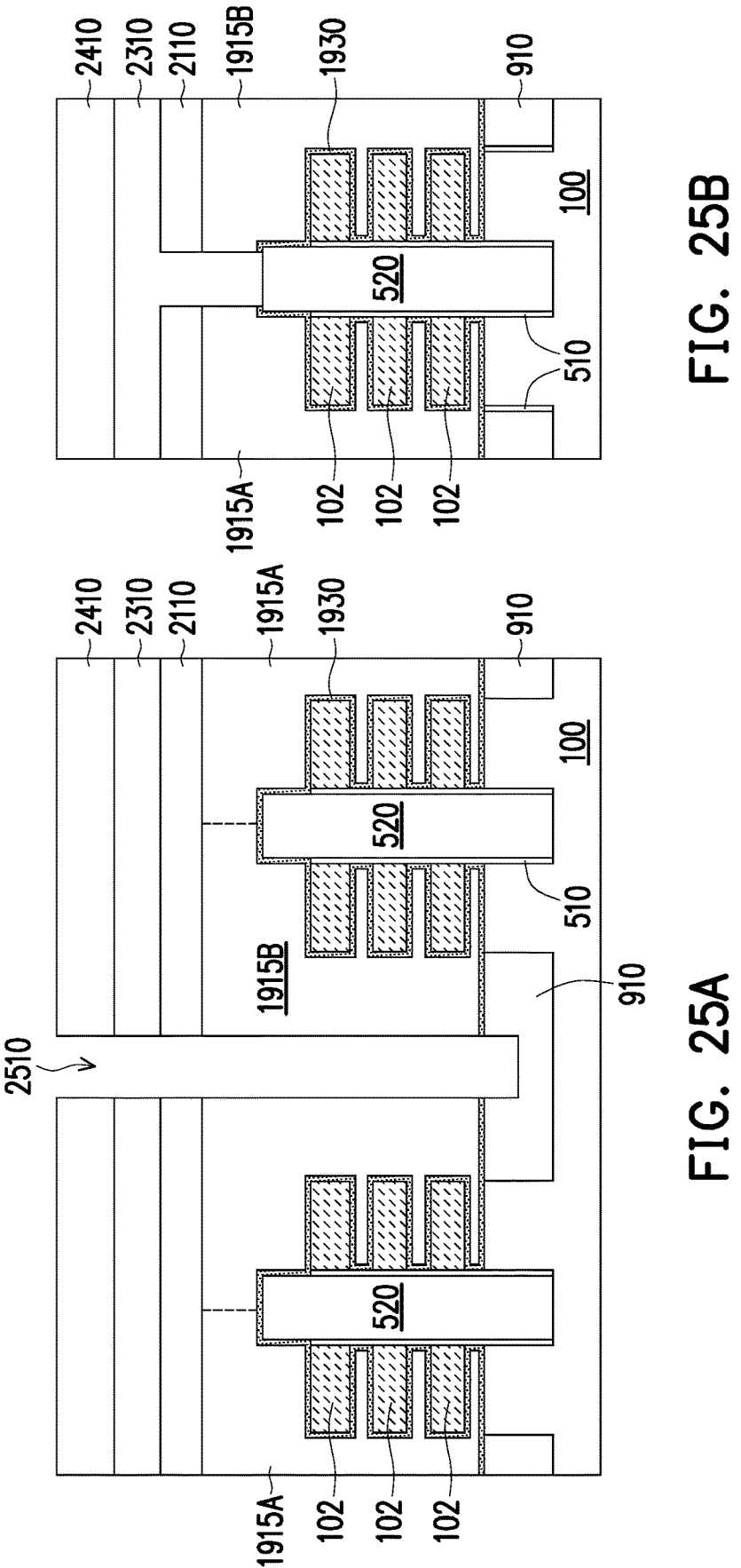

Referring to FIGS. 25A and 25B, in some embodiments, using the photoresist pattern 2410 as a mask and through the trench opening S2, the second hard mask layer 2310 and the first hard mask layer 2110 are patterned and the underlying metal gate electrode 1915 (1915B as shown in FIG. 25A) and the gate dielectric layer 1930 are etched to form the trench 2510 through one or more etching processes. In some embodiments, through the etching process, the hard mask layers 2310, 2110 and the gate structure 1900 below the trench opening S2 are removed, and the isolation feature 910 is further etched. That is, the trench 2510 penetrates through (cuts through) the gate structure 1900 and extends into isolation features 910. In some embodiments, the etch process includes at least one dry etching process (e.g., RIE etching), and/or other etching methods. After forming the trench 2510, the photoresist pattern 2410 is removed.

Figures 26A, 26B:
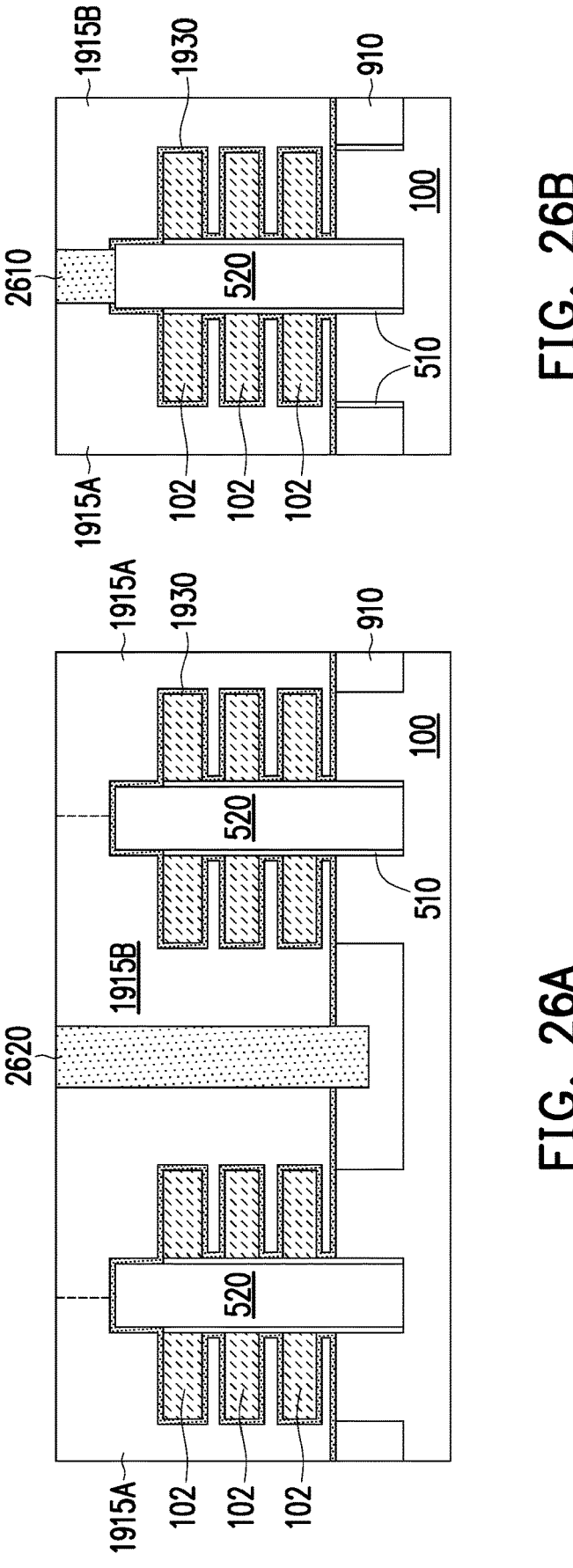
Figure 26C:
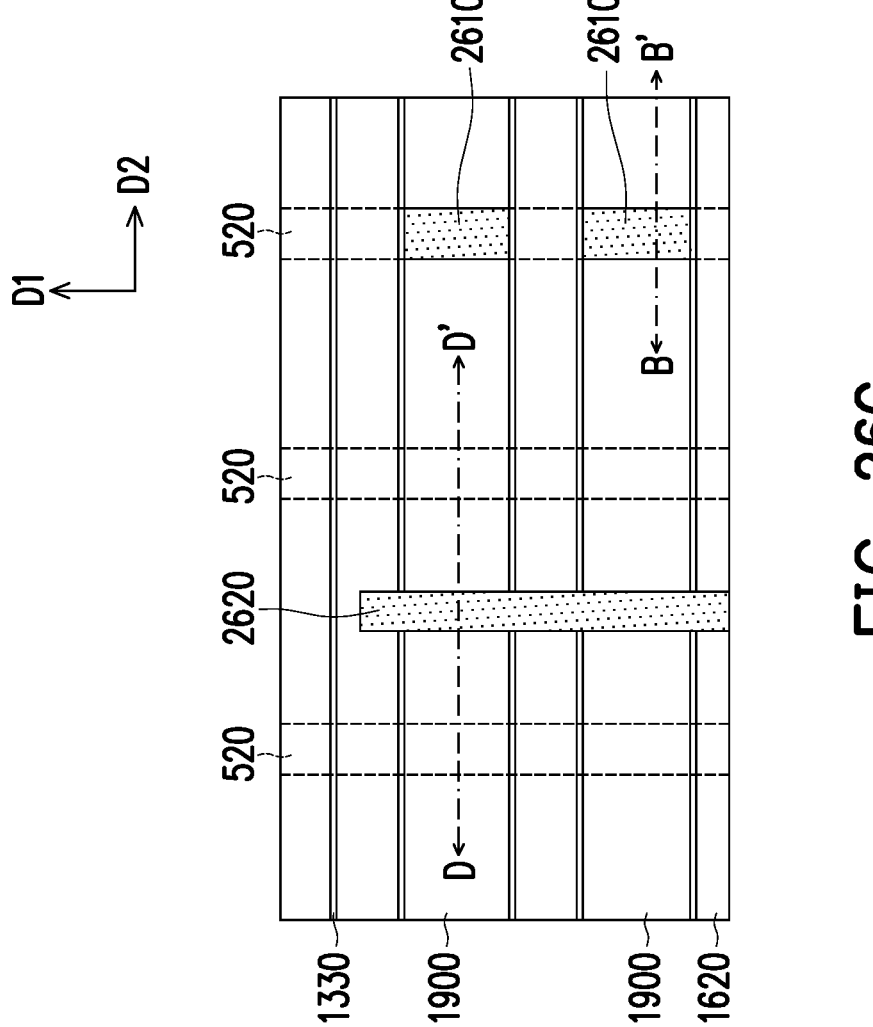

FIG. 26C is a schematic plane view showing an exemplary structure of the semiconductor device according to some embodiments of the present disclosure. FIG. 26A is a schematic cross-sectional view illustrating a cross-section along a D-D' line as shown in FIG. 26C, and FIG. 26B is a schematic cross-sectional view illustrating a cross-section along a B-B' line as shown in FIG. 26C. Following the process depicted in FIG. 25A and FIG. 25B, referring to FIGS. 26A and 26B, in some embodiments, the hard mask layers 2310, 2110 are removed. Afterwards, a first isolation block 2610 is formed in the trench 2210 and a second isolation block 2620 is formed in the trench 2510. As seen in FIG. 26A, for the fork-sheet transistor structures 17 and 18, the second isolation block 2620 cutting through the gate structure 1900 physically and electrically isolates the fork-sheet transistor structures 17 and 18.

In some embodiments, an insulating material (not shown) is filled into and fills up the trench 2210 and the trench 2510 after the first hard mask layer 2110 and the second hard mask layer 2310 are removed, and a planarization process is later performed to remove the extra insulating material to form the first isolation block 2610 and the second isolation block 2620. In some embodiments, the first isolation block 2610 and the second isolation block 2620 include the same dielectric material(s). In some embodiments, the first isolation block 2610 and the second isolation block 2620 include one or more dielectric materials, such as silicon nitride (SiN), silicon carbonitride (SiCN), silicon oxide such as silicon dioxide ($SiO_2$), nitrogen-containing oxide such as silicon oxynitride (SiON), carbon-containing oxide such as silicon oxycarbide (SiOC), carbon-containing and nitrogen-containing oxide such as silicon oxycarbonitride (SiOCN), or combinations thereof, fluoride-doped silicate glass (FSG), a high-k dielectric material, and/or other suitable insulating material. For example, the high-K dielectric material includes hafnium oxide ($HfO_2$), tantalum pentoxide ($Ta_2O_5$), titanium dioxide ($TiO_2$), Zirconium dioxide ($ZrO_2$), aluminum oxide ($Al_2O_3$), yttrium oxide ($Y_2O_3$), lanthanum doped, or combinations thereof. As described in the previous paragraphs, the trench 2210 penetrates through the gate structure 1900 and reaches the dielectric wall 520, while the trench 2510 penetrating through the gate structure 1900 and reaches the isolation feature 910. In some embodiments, the trench 2210 has a depth smaller than a depth of the trench 2510. In some embodiment, the first isolation block 2610 formed in the trench 2210 has an extending depth smaller than an extending depth of the second isolation block 2620 formed in the trench 2510. In some embodiments, after removing the hard mask layers 2310, 2110, a first insulating material (not shown) is filled into the trench 2210 to form the first isolation block 2610, and a second insulating material (not shown) is filled into the trench 2510 to form the second isolation block 2620. In one embodiment, the material of the first isolation block 2610 is different from the material of the second isolation block 2620.

In some embodiment, referring to FIG. 26C, the first isolation block 2610 (two are shown) that is located right above the dielectric wall 520 and between the two adjacent sidewall spacers 1330 dissects (cuts) the gate structure 1900 into segments. Referring to FIG. 26C, the second isolation block 2620 extends over (cuts through) at least two parallel gate structures 1900, the sidewall spacers 1330 and the adjacent ILD strips 1620. From the top view of FIG. 26C, the second isolation block 2620 is shaped as a strip, and the first isolation blocks 2610 are arranged as two separate blocks respectively cutting two parallel gate structures 1900. In some embodiments, a span of the second isolation block 2620 is larger than a span of the first isolation block 2610 as shown in FIG. 26C.

Figure 27:
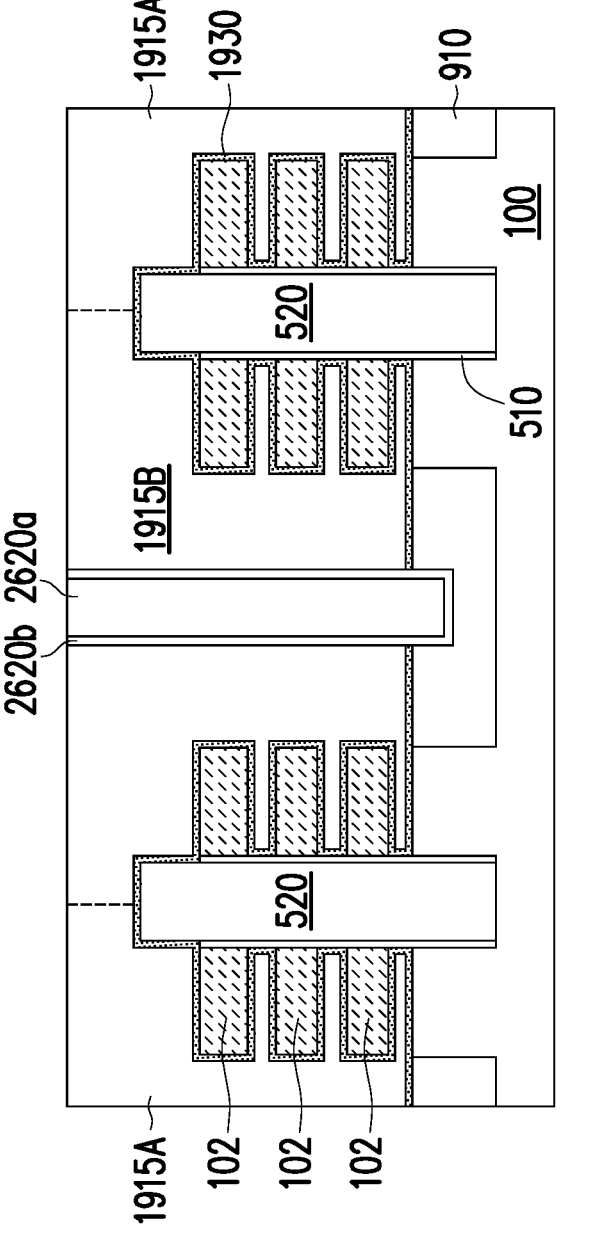

FIG. 27 is a schematic cross-sectional view illustrating a cross-section of the exemplary structure along the D-D' line in some alternative embodiments of this disclosure. Referring to FIG. 27, in some embodiment, the structure is similar to the structure of FIG. 26A except that the second isolation block 2620 includes multiple insulator layers. For example, the second isolation block 2620 includes an inner layer 2620a and an outer layer 2620b formed sequentially from different dielectric materials. For example, the inner layer 2620a includes an oxide layer, and the outer layer 2620b includes a silicon nitride layer.

Figure 28:
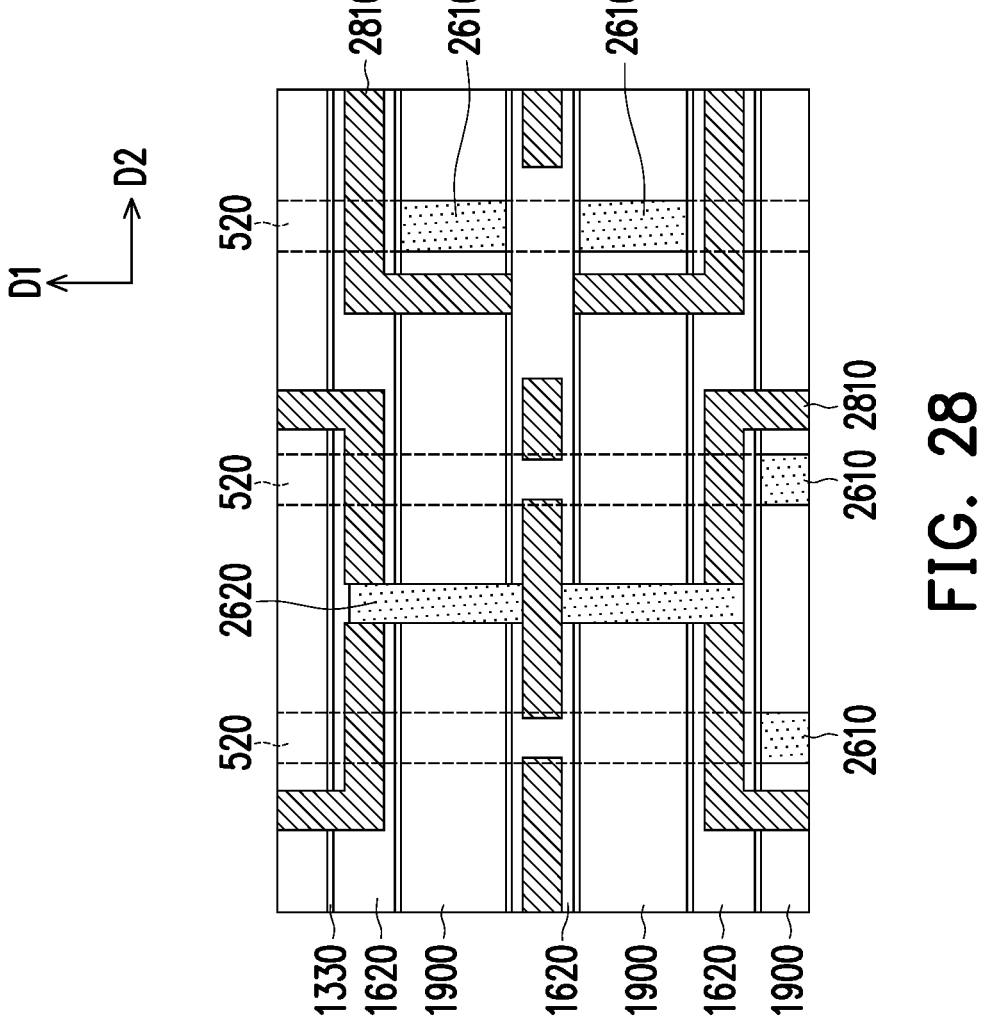
FIG. 28 is a schematic plane view showing an exemplary structure of the semiconductor device according to some embodiments of the present disclosure.

FIG. 28 is a schematic plane view showing an exemplary structure of the semiconductor device according to some embodiments of the present disclosure. The schematic plane view of FIG. 28 shows a wider span compared to the plane view depicted in FIG. 26C. As shown in FIG. 28, the first isolation blocks 2610 (four are shown) each located right above the dielectric wall 520 and between the two adjacent sidewall spacers 1330 dissects (cuts) the gate structure 1900 into segments, and the second isolation block 2620 extends over (cuts through) at least two parallel gate structures 1900, the sidewall spacers 1330 and the adjacent ILD strips 1620. Following the process depicted in FIG. 26C, referring to FIG. 28, in some embodiment, the contacts 2810 are formed and are respectively electrically connected to the transistors. In some embodiments, some contacts 2810 are located directly on and connected to the gate structures 1900. In some embodiments, some contacts 2810 are located on the ILD strips and are electrically connected to the underlying source/drain features 1510. In some embodiments, the contacts 2810 include metallic contacts, and the material of the metallic contacts includes W, Co, Ru, Ir, Mo, Cu, Al, combinations thereof, or the like. In some embodiments, before forming the metallic contacts, a barrier material, such as TiN, TaN, or a combination thereof, may be formed as a contact barrier. The formation of the contacts 2810 may involve forming an insulating dielectric pattern (not shown), forming openings into various depths to expose the source/drain features or the gate structures, and forming contacts inside the openings.

According to the embodiments of this disclosure, different types of isolation blocks are formed through different photomasks and different etching processes. In some embodiments, the metal gate cutting process including at least two photolithography and exposure processes using two different photomasks followed by etching steps. Through the two-staged gate cutting process, precise control and better alignment for the formed isolation blocks can be achieved along with a larger process window, leading to more relaxed spacing requirements between adjacent fork-sheet nanostructure. As different types of isolation blocks are formed through individual processes, the isolation blocks are precisely landed on the dielectric isolation walls of the fork-sheet nanostructure(s), significantly reducing the occurrence of misalignment and/or over-etching and improving the reliability and performance of the transistors.

In accordance with some embodiments of the present disclosure, a semiconductor device, comprising: a substrate; a first semiconductor structure disposed on the substrate, wherein the first semiconductor structure includes first sheet structures, second sheet structures, a first gate structure wrapping around the first sheet structures and the second sheet structures, and a first dielectric wall disposed between and separating the first sheet structures and the second sheet structures; a second semiconductor structure disposed on the substrate and disposed beside the first semiconductor structure, wherein the second semiconductor structure includes a second gate structure wrapping around third sheet structures of the second semiconductor structure; a first isolation block, disposed on the first dielectric wall of the first semiconductor structure and separating the first gate structure into a first gate portion wrapping around the first sheet structures and a second gate portion wrapping around the second sheet structures; and a second isolation block, disposed between the first semiconductor structure and the second semiconductor structure and separating the first gate structure from the second gate structure, wherein the first isolation block has an extending depth smaller than an extending depth of the second isolation block.

In accordance with some embodiments of the present disclosure, a semiconductor device, comprising: a substrate; a first semiconductor structure disposed on the substrate, wherein the first semiconductor structure includes first sheet structures, second sheet structures, a first gate structure wrapping around the first sheet structures and the second sheet structures, and a dielectric wall disposed between and separating the first sheet structures and the second sheet structures; a second semiconductor structure disposed on the substrate and disposed beside the first semiconductor structure, wherein the second semiconductor structure includes third sheet structures and a second gate structure wrapping around the third sheet structures; a third semiconductor structure disposed on the substrate, disposed beside and between the first and second semiconductor structures, wherein the third semiconductor structure includes fourth sheet structures and a third gate structure wrapping around the fourth sheet structures; a first isolation block, disposed on the dielectric wall of the first semiconductor structure and separating the first gate structure and the third gate structure; and a second isolation block, disposed between the second semiconductor structure and the third semiconductor structure and separating the second gate structure and the third gate structure, wherein the first isolation block has an extending depth smaller than an extending depth of the second isolation block.

In accordance with some embodiments of the present disclosure, a method of forming a semiconductor device, comprising: a method of forming a semiconductor device, comprising: forming a substrate; forming first sheet structures, second sheet structures, and third sheet structures on the substrate; forming a dielectric wall between the first sheet structures and the second sheet structures and separating the first sheet structures and the second sheet structures; forming a first gate structure wrapping around the first sheet structures and wrapping around the second sheet structures and forming a second gate structure wrapping around the third sheet structures; forming a first isolation block on the dielectric wall and separating the first gate structure into a first gate portion and a second gate portion; and forming a second isolation block between the first gate structure and the second gate structure and separating the first gate structure and the second gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a first semiconductor structure disposed on the substrate, wherein the first semiconductor structure includes first sheet structures, second sheet structures, a first gate structure wrapping around the first sheet structures and the second sheet structures, and a first dielectric wall disposed between and separating the first sheet structures and the second sheet structures;
a second semiconductor structure disposed on the substrate and disposed beside the first semiconductor structure, wherein the second semiconductor structure includes a second gate structure wrapping around third sheet structures of the second semiconductor structure;
a first isolation block, disposed on the first dielectric wall of the first semiconductor structure and separating the first gate structure into a first gate portion wrapping around the first sheet structures and a second gate portion wrapping around the second sheet structures; and
a second isolation block, disposed between the first semiconductor structure and the second semiconductor structure and separating the first gate structure from the second gate structure, wherein the first isolation block has an extending depth smaller than an extending depth of the second isolation block,
wherein the first gate structure sandwiched between two facing sidewall spacers extends along a first direction, and the first isolation block extends from one sidewall spacer to the other sidewall spacer of the two facing sidewall spacers in a second direction perpendicular to the first direction.

2. The semiconductor device according to claim 1, further comprising a shallow trench isolation structure located between the first and second semiconductor structures, wherein the second isolation block located between the first and the second gate structures extends vertically from a top surface of the first and the second gate structure to the shallow trench isolation structure between the first and the second semiconductor structures.

3. The semiconductor device according to claim 2, wherein the second isolation block penetrates into the shallow trench isolation structure between the first and second semiconductor structures.

4. The semiconductor device according to claim 1, further comprising first source and drain regions located at opposite sides of the first sheet structures and second source and drain regions located at opposite sides of the second sheet structures.

5. The semiconductor device according to claim 4, wherein the first dielectric wall is disposed between the first source and drain regions and the second source and drain regions.

6. The semiconductor device according to claim 1, wherein the second isolation block includes multiple dielectric layers, and top surfaces of the first and second isolation blocks and the first gate structure are level.

7. The semiconductor device according to claim 1, wherein a material of the first isolation block is different from a material of the second isolation block.

8. The semiconductor device according to claim 7, wherein the first isolation block includes silicon oxide, and the second isolation block includes silicon oxide and silicon nitride.

9. A semiconductor device, comprising:
a substrate;
a first semiconductor structure disposed on the substrate, wherein the first semiconductor structure includes first sheet structures, second sheet structures, a first gate structure wrapping around the first sheet structures and the second sheet structures, and a dielectric wall disposed between and separating the first sheet structures and the second sheet structures;

a second semiconductor structure disposed on the substrate and disposed beside the first semiconductor structure, wherein the second semiconductor structure includes third sheet structures and a second gate structure wrapping around the third sheet structures;

a third semiconductor structure disposed on the substrate, disposed beside and between the first and second semiconductor structures, wherein the third semiconductor structure includes fourth sheet structures and a third gate structure wrapping around the fourth sheet structures;

a first isolation block, disposed on the dielectric wall of the first semiconductor structure and separating the first gate structure and the third gate structure; and a second isolation block, disposed between the second semiconductor structure and the third semiconductor structure and separating the second gate structure and the third gate structure, wherein the first isolation block has an extending depth smaller than an extending depth of the second isolation block, wherein the first gate structure sandwiched between two facing sidewall spacers extends along a first direction, and the first isolation block extends from one sidewall spacer to the other sidewall spacer of the two facing sidewall spacers in a second direction perpendicular to the first direction.

10. The semiconductor device according to claim 9, further comprising shallow trench isolation structures located between the first and second semiconductor structures and between the second and third semiconductor structures, wherein the second isolation block located between the second and the third gate structures extends vertically from a top surface of the second or third gate structure to the shallow trench isolation structure between the second and third semiconductor structures.

11. The semiconductor device according to claim 10, wherein the second isolation block penetrates into the shallow trench isolation structure between the second and third semiconductor structures.

12. The semiconductor device according to claim 9, further comprising first source and drain regions located at opposite sides of the first sheet structures and second source and drain regions located at opposite sides of the second sheet structures.

13. The semiconductor device according to claim 12, wherein the dielectric wall is disposed between the first source and drain regions and the second source and drain regions.

14. The semiconductor device according to claim 9, wherein the second isolation block includes multiple dielectric layers.

15. The semiconductor device according to claim 9, wherein a material of the first isolation block and a material of the second isolation block are different.

16. A method of forming a semiconductor device, comprising:

forming a substrate;

forming first sheet structures, second sheet structures, and third sheet structures on the substrate;

forming a dielectric wall between the first sheet structures and the second sheet structures and separating the first sheet structures and the second sheet structures;

forming a first gate structure wrapping around the first sheet structures and wrapping around the second sheet structures and forming a second gate structure wrapping around the third sheet structures, wherein the first gate structure is formed between two facing sidewall spacers and extends along a first direction;

forming a first isolation block on the dielectric wall and separating the first gate structure into a first gate portion and a second gate portion, wherein the first isolation block is formed between the two facing sidewall spacers, extending from one sidewall spacer to the other sidewall spacer of the two facing sidewall spacers in a second direction perpendicular to the first direction; and forming a second isolation block between the first gate structure and the second gate structure and separating the first gate structure and the second gate structure.

17. The method according to claim 16, further comprising forming a shallow trench isolation structure between the second and third sheet structures, wherein the second isolation block between the first and the second gate structures extends vertically from a top surface of the first and the second gate structure to the shallow trench isolation structure.

18. The method according to claim 17, wherein the first isolation block has an extending depth smaller than an extending depth of the second isolation block.

19. The method according to claim 16, wherein a material of the first isolation block is different from a material of the second isolation block.

20. The method according to claim 16, further comprising performing a planarizing process to form top surfaces of the first isolation block and the second isolation block levelled with a top surface of the first gate structure.

* * * * *